(12) United States Patent
Kim et al.

(10) Patent No.: US 10,890,997 B2
(45) Date of Patent: Jan. 12, 2021

(54) DISPLAY DEVICE

(71) Applicant: Samsung Display Co., Ltd., Yongin-si (KR)

(72) Inventors: Jeong Woo Kim, Yongin-si (KR); Sung Hyun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/521,481

(22) Filed: Jul. 24, 2019

(65) Prior Publication Data

US 2020/0125203 A1  Apr. 23, 2020

(30) Foreign Application Priority Data

Oct. 18, 2018 (KR) .................. 10-2018-0124670

(51) Int. Cl.
  *G06F 3/041* (2006.01)
  *H01L 27/32* (2006.01)
  *G06F 3/044* (2006.01)

(52) U.S. Cl.
  CPC .......... *G06F 3/0412* (2013.01); *G06F 3/0443* (2019.05); *H01L 27/323* (2013.01); *G06F 2203/04102* (2013.01); *G06F 2203/04112* (2013.01); *H01L 27/3244* (2013.01)

(58) Field of Classification Search
  CPC ...... G06F 3/0412; G06F 3/0443; G06F 3/044; G06F 2203/04111; G02F 1/13338; H01L 27/323
  See application file for complete search history.

(56) References Cited

U.S. PATENT DOCUMENTS

| 10,062,739 B2* | 8/2018 | Jang ...................... H01L 27/323 |
| 10,528,193 B2* | 1/2020 | Nakamura ............. B32B 15/04 |
| 2013/0017321 A1 | 1/2013 | Kim et al. |
| 2015/0227240 A1* | 8/2015 | Hong ..................... G06F 3/044 345/174 |
| 2018/0224967 A1 | 8/2018 | Church et al. |
| 2018/0224968 A1* | 8/2018 | Church .................. G06F 3/044 |
| 2019/0146611 A1 | 5/2019 | Park et al. |
| 2019/0391694 A1 | 12/2019 | Lin et al. |

FOREIGN PATENT DOCUMENTS

| CN | 207601767 | 7/2018 |
| EP | 3276470 | 1/2018 |

OTHER PUBLICATIONS

Extended European Search Report dated Feb. 18, 2020, issued in European Patent Application No. 19201508.9.

* cited by examiner

*Primary Examiner* — Sardis F Azongha
(74) *Attorney, Agent, or Firm* — H.C. Park & Associates, PLC

(57) ABSTRACT

A display device including a display panel including a light emitting element and an encapsulation layer covering the light emitting element; and an input sensing unit disposed on the display panel. The input sensing unit includes a first conductive pattern disposed on the encapsulation layer, and including a first portion and a second portion extend from the first portion; an insulation layer covering the first conductive pattern; and a second conductive pattern disposed on the insulation layer, and including a third portion overlapping the at least a portion of the first portion of the first conductive pattern and a fourth portion extend from the third portion. A width of the first portion is less than a width of the second portion.

18 Claims, 21 Drawing Sheets

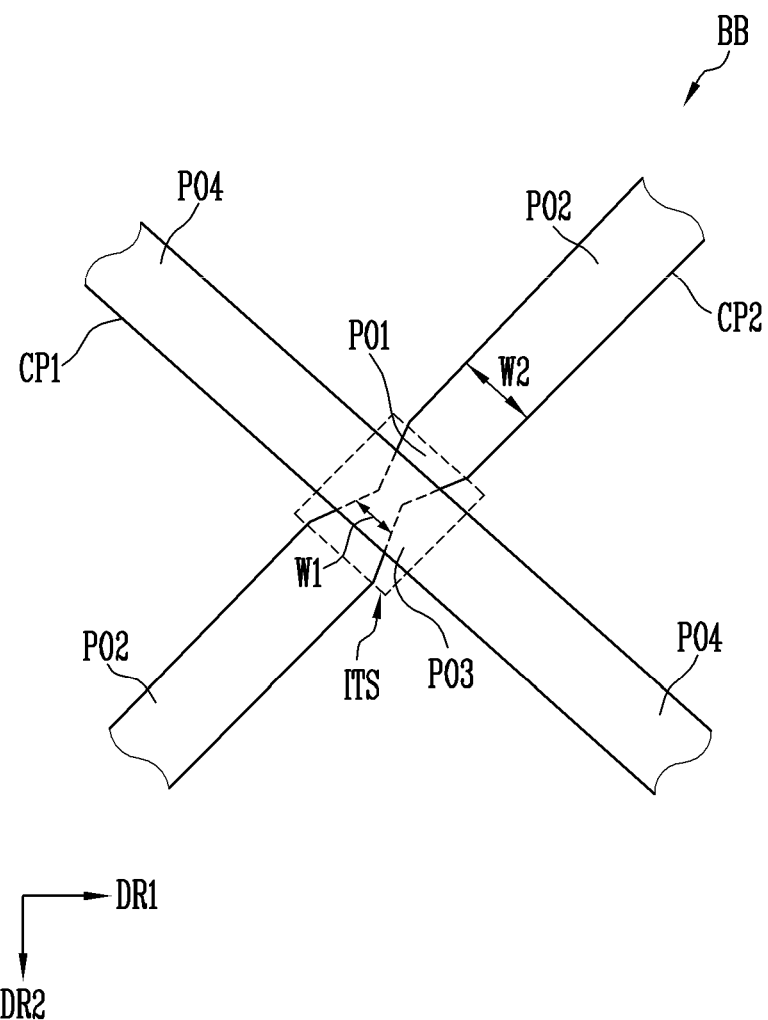

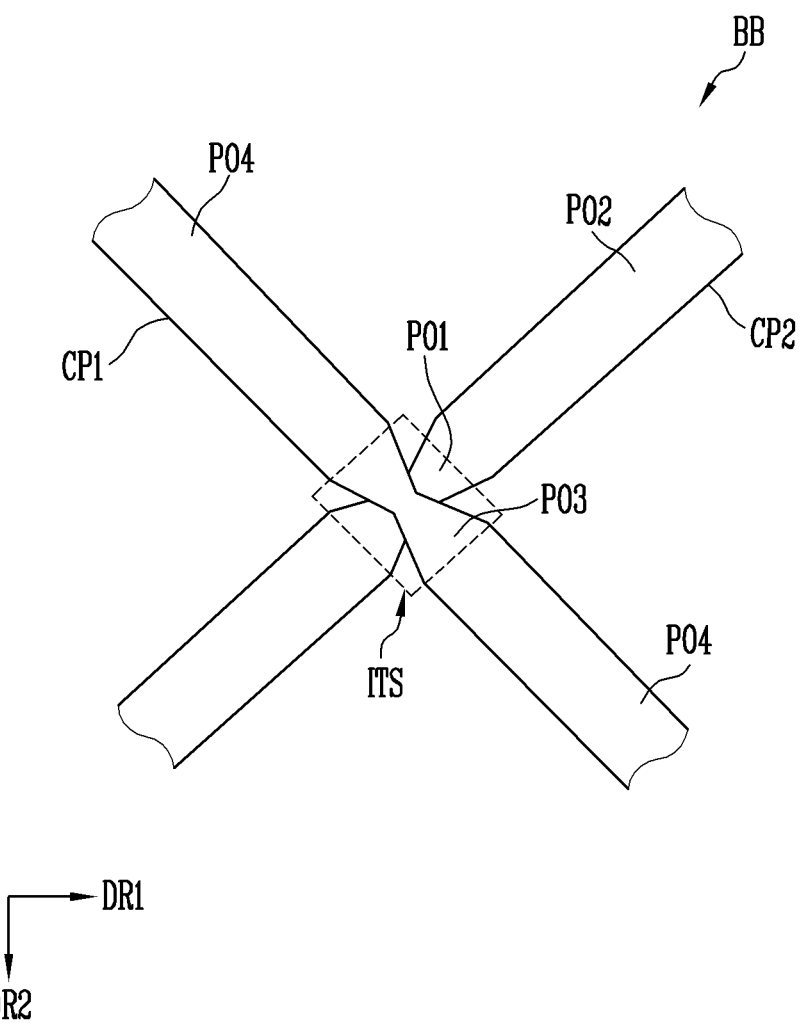

DISPLAY DEVICE

CROSS-REFERENCE TO RELATED APPLICATION

This application claims priority from and the benefit of Korean Patent Application No. 10-2018-0124670, filed on Oct. 18, 2018, which is hereby incorporated by reference for all purposes as if fully set forth herein.

BACKGROUND

Field

Exemplary embodiments of the invention relate generally to a display device, and more specifically, to an input sensing unit and a display device including the same.

Discussion of the Background

Recently, display devices have been developed in the direction of having an information input function in addition to an image display function. The information input function of the display device may be implemented as an input sensing unit for receiving a user's touch or a touch by a predetermined tool.

An input sensing unit, such as a touch sensor, may be attached to one side of a display panel that implements the image display function or may be integrally formed with the display panel. A user can input information by pressing or touching the input sensing unit while watching the image implemented in the display panel.

The input sensing unit may be applied not only to a flat panel display but also to a flexible display device, a curved display device, a foldable display device and a bendable display device, and the like.

Research is underway to reduce the thickness of the display panel and the touch sensor and to prevent the occurrence of a resistance and a short circuit between the upper and lower conductive lines causing a failure of the input sensing unit, a sensitivity lowering in order to freely deform the shape of the display device.

The above information disclosed in this Background section is only for understanding of the background of the inventive concepts, and, therefore, it may contain information that does not constitute prior art.

SUMMARY

Exemplary embodiments of the present invention provide a display device that reduces the area of overlap between the first conductive pattern and the second conductive pattern.

Additional features of the inventive concepts will be set forth in the description which follows, and in part will be apparent from the description, or may be learned by practice of the inventive concepts.

An exemplary embodiment of the present invention provides a display device including a display panel including a light emitting element and an encapsulation layer covering the light emitting element; and an input sensing unit disposed on the display panel. The input sensing unit includes a first conductive pattern disposed on the encapsulation layer, the first conductive pattern including a first portion and a second portion extending from the first portion; an insulation layer covering the first conductive pattern; and a second conductive pattern disposed on the insulation layer, the second conductive pattern including a third portion overlapping at least a portion of the first portion of the first conductive pattern and a fourth portion extending from the third portion. A width of the first portion is less than a width of the second portion.

A width of the third portion may be less than the width of the fourth portion.

A second portion may not overlap the second conductive pattern and the fourth portion does not overlap the first conductive pattern.

The first conductive pattern and the second conductive pattern may correspond to a plurality of mesh lines defining a plurality of mesh holes.

The first portion and the third portion may be defined as regions included in a crossing region where the first conductive pattern and the second conductive pattern cross, and an area of the first portion of the first conductive pattern included in the crossing region may be smaller than an area of the second portion included in a unit region of the same size as the crossing region An area of the third portion of the second conductive pattern included in the crossing region may be smaller than an area of the fourth portion included in the unit region.

The second conductive pattern may include a first sensing electrode including first sensing cells and a first connection part that connects the first sensing cells adjacent to each other, and extending in a first direction; and second sensing cells arranged in a second direction crossing the first direction.

The first conductive pattern may include a second connection part that connects the second sensing cells adjacent to each other to form a second sensing electrode, wherein the second sensing cells and the second connection part are connected through a contact hole passing through the insulation layer.

A portion of the second connection part overlaps a portion of the first sensing cell adjacent to the second connection part of the first sensing cells.

The second connection part may include the first portion and the second portion. The first sensing cell overlapping the second connection part of the first sensing cells may include the third portion overlapping the second connection part and the fourth portion not overlapping the second connection part.

A width of a portion of the second connection part which overlaps the second sensing cells may be greater than the width of the first portion.

A width of a portion of the second connection part which overlaps the second sensing cells may be equal to the width of the second portion.

A portion of the second connection part may overlap a portion of the first connection part.

The second connection part may include the first portion and the second portion, and the first connection part may include a third portion overlapping the first portion of the second connection part and a fourth portion not overlapping the second connection part.

A width of the third portion may be less than a width of the fourth portion.

Another exemplary embodiment of the present invention provides a display device including a display panel including a light emitting element and an encapsulation layer covering the light emitting element; and an input sensing unit disposed on the display panel. The input sensing unit may include a first conductive pattern disposed on the encapsulation layer, the input sensing unit including a first portion and a second portion extend from the first portion; an insulation layer covering the first conductive pattern; and a second conductive pattern disposed on the insulation layer, the second conductive pattern including a third portion overlapping at least a portion of the first portion of the first conductive pattern and a fourth portion extend from the third portion. A width of the third portion is less than a width of the fourth portion.

A width of the first portion may be less than a width of the second portion.

The second conductive pattern may include a first sensing electrode including first sensing cells and a first connection part that connects the first sensing cells adjacent to each other, and extending in a first direction; and second sensing cells arranged in a second direction crossing the first direction. The first conductive pattern may include a second connection part that connects the second sensing cells adjacent to each other to form a second sensing electrode, and the second sensing cells and the second connection part are connected through a contact hole passing through the insulation layer.

A portion of the second connection part may overlap a portion of the first sensing cells adjacent to the second connection part.

A portion of the second connection part may overlap with a portion of the first connection part.

Another exemplary embodiment of the present invention provides a display device including a display panel including a light emitting element and an encapsulation layer covering the light emitting element; and an input sensing unit disposed on the display panel. The input sensing unit may include a second connection part disposed on the encapsulation layer; an insulation layer covering the second connection part; a first sensing electrode disposed on the insulation layer, including a first sensing cells and a first connection part connecting the first sensing cells adjacent to each other, and extending in a first direction; and a second sensing electrode disposed on the same layer as the first sensing electrode and including second sensing cells arranged in a second direction crossing the first direction not to contact the first sensing electrode. The second sensing electrode may be formed by connecting the second sensing cells adjacent to each other through the second connection part, and a width of the first portion of the second connection part including a portion overlapping the first sensing electrode is less than a width of the second portion extending from the first portion.

Each of the first sensing electrode and the second sensing electrode may include a plurality of mesh lines defining a plurality of mesh holes.

The first portion of the second connection part may overlap the first connection part.

The first connection part may include a third portion overlapping the first portion of the second connection part and a fourth portion extending from the third portion, and a width of the third portion may be less than a width of the fourth portion.

The first portion of the second connection part may overlap the first sensing cell adjacent to the second connection part.

The adjacent first sensing cell may include a third portion overlapping the first portion and a fourth portion extending from the third portion, and a width of the third portion may be less than a width of the fourth portion.

A width of a portion of the second connection part which overlaps the second sensing electrode may be greater than a width of the first portion of the second connection part overlapping the first sensing electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 7A, FIG. 7B, FIG. 7C, and FIG. 7D are enlarged views schematically illustrating examples of a BB portion of an input sensing unit of FIG. 5.

FIG. 9A and FIG. 9B are enlarged views schematically illustrating examples of a BB portion of an input sensing unit of FIG. 5.

DETAILED DESCRIPTION

Figure 1:
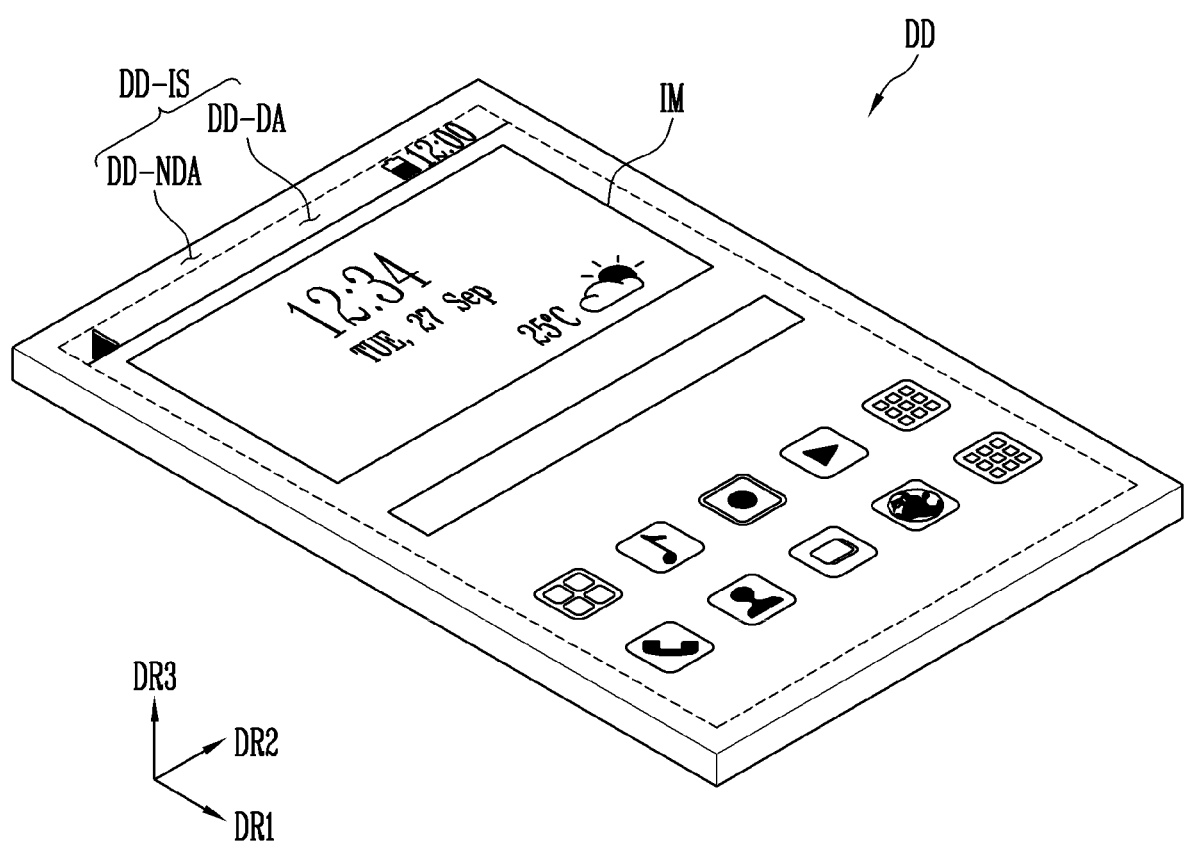
FIG. 1 is a perspective view illustrating a display device according to exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, with reference to accompanying drawings, an exemplary embodiment of the present invention will be described in more detail. Use the same reference signs for the same constituent elements on the drawing and omit duplicate descriptions for the same constituent elements.

FIG. 1 is a perspective view illustrating a display device according to an exemplary embodiment of the present invention.

Referring to FIG. 1, a display device DD may display an image IM by using a display surface DD-IS. The display surface DD-IS may be parallel to a plane defined by the first direction axis DR1 and the second direction axis DR2. The normal direction of the display surface DD-IS, that is, the thickness direction of the display device DD, may be indicated by the third direction axis DR3.

The front (or top) and back (or bottom) of each member, layer, or unit described below may be distinguished by the third direction axis DR3. However, the first to third direction axes DR1, DR2, and DR3 are only examples, and the directions indicated by the first to third direction axes DR1, DR2, and DR3 are merely relative concepts and may be converted into other directions. Hereinafter, the first to third directions may be the direction indicated by the first to third direction axes DR1, DR2, and DR3 respectively and may refer to the same reference numerals as the first to third direction axes DR1, DR2, and DR3.

The display device DD shown in FIG. 1 may have a planar display surface. The inventive concepts are not limited thereto, and a display device DD according to an exemplary embodiment of the present invention may have various types of display surfaces capable of displaying an image such as a curved display surface or a stereoscopic display surface. In a case where the display device DD according to an exemplary embodiment of the present invention has the stereoscopic display surface, the stereoscopic display surface may include a plurality of display regions oriented in different directions as an example. The stereoscopic display surface may be implemented as a polygonal columnar display surface.

The display device DD may be a flexible display device. For example, the display device DD may be applied to a foldable display device, a bendable display device, a rollable display device, and the like. The inventive concepts are not limited thereto, and the display device DD may be a rigid display device.

The display device DD shown in FIG. 1 illustrates a display device DD that may be applied to a mobile phone device. However, this is an example, and the display device DD may be not only applied to a large electronic device, such as a television, a monitor, and an electric signboard, but also to a small electronic device, such as a tablet, a navigation device, a game device, and a smart watch. Also, the display device DD may be applied to a wearable electronic device, such as a head-mount display.

As shown in FIG. 1, the display surface DD-IS of the display device DD may include a display region DD-DA that displays the image and a non-display region DD-NDA adjacent to the display region DD-DA. The non-display region DD-NDA is the region where the image is not displayed. The non-display region DD-NDA may be disposed outside the display region DD-DA.

Figure 2A:
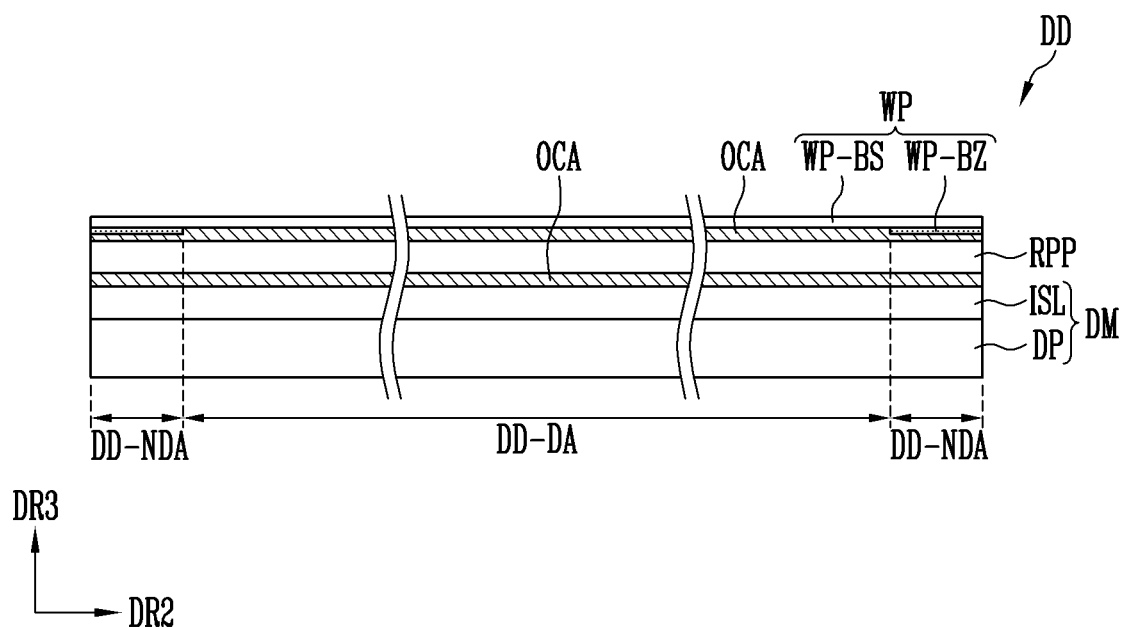
FIG. 2A, FIG. 2B, and FIG. 2C are cross-sectional views schematically illustrating a display device according to exemplary embodiment of the present invention.
Figure 2B:
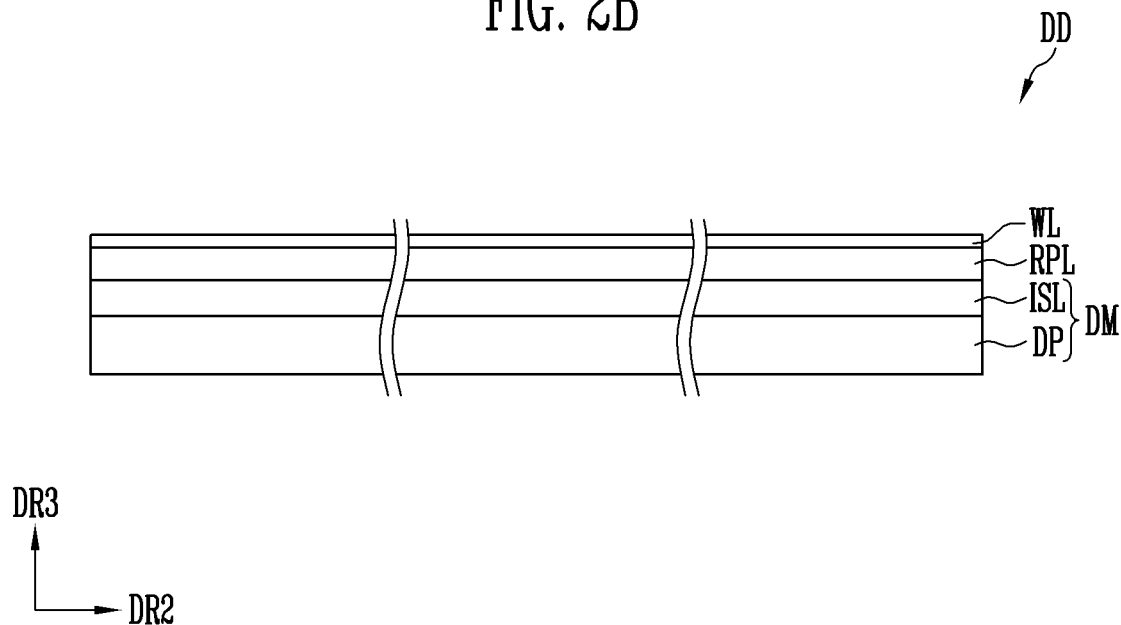
Figure 2C:
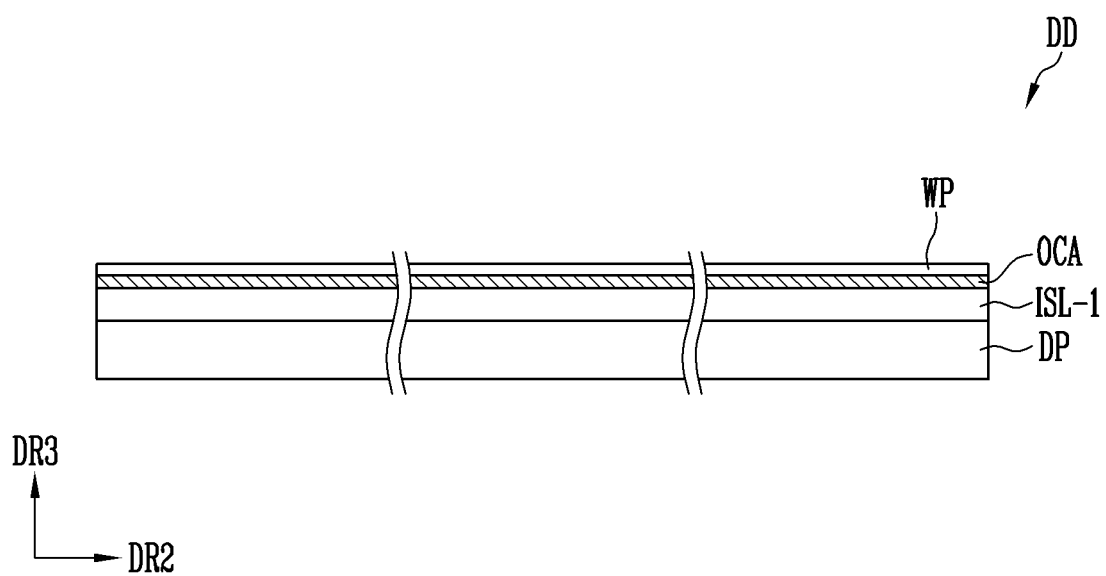

FIGS. 2A to 2C are cross-sectional views schematically illustrating a display device according to exemplary embodiment of the present invention.

FIGS. 2A to 2C simply illustrate the stacking relationship of the functional panels and/or functional units that make up the display device DD.

Referring to FIGS. 2A to 2C, the display device DD may include a display panel DP, an input sensing unit ISL and ISL-1, and a window unit WL and WP. The display device DD may further include an antireflection panel RPP.

At least some of the display panel DP, the input sensing unit ISL and ISL-1, and the window unit WL and WP may be formed by a continuous process, or may be joined together by using an adhesive member. The adhesive member may include conventional glue or adhesive. The adhesive member in shown in FIGS. 2A and 2C may be, for example, an optical transparent adhesive member ("Optically Clear Adhesive" or "OCA").

In an exemplary embodiment, the input sensing unit ISL and ISL-1 may sense a contact or input by an external medium such as a hand or pen to the display surface DD-IS of the display device DD.

In FIGS. 2A to 2C, the corresponding configuration formed through the continuous process with other configuration of the input sensing unit ISL and ISL-1 and the window unit WL and WP is expressed as "layer". The corresponding configuration combined through the adhesive member with other configuration of the touch sensor and the window unit is expressed as "panel". The panel may include a base layer providing a base surface, for example a synthetic resin film, a composite material film, a glass substrate, etc., but "layer" may not include the base layer. In other words, the units represented as "layer" may be disposed on the base plane provided by other units.

The input sensing unit ISL and ISL-1 and the window unit WL and WP are respectively represented by an input sensing panel ISL-1 and a window panel WP or an input sensing layer ISL and a window layer WL depending on presence or absence of the base layer.

As shown in FIG. 2A, the display device DD may include the display panel DP, the input sensing layer ISL, the antireflection panel RPP, and the window panel WP.

In an exemplary embodiment, the input sensing layer ISL may be disposed directly on the display panel DP. In this specification, "the B configuration is directly disposed on the A configuration" means that no separate adhesive layer or adhesive member is disposed between the A configuration and the B configuration. The B configuration may be formed through a continuous process on the base surface provided by the A configuration after the A configuration is formed.

The display panel DP and the input sensing layer ISL disposed on the display panel DP may be defined together as a display module DM. An optical transparent adhesive member OCA may be disposed between the display module DM and the antireflection panel RPP, and between the antireflection panel RPP and the window panel WP, respectively.

The input sensing layer ISL may be disposed inside the display panel DP or on the display panel DP.

In an exemplary embodiment, the display panel DP may be a light emitting display panel, but the display panel DP is not particularly limited thereto. For example, the display panel DP may be an organic light emitting panel or a quantum dot light emitting display panel.

The antireflection panel RPP reduces the reflectance of external light incident from above the window panel WP. In an exemplary embodiment, the antireflection panel RPP may include a retarder and a polarizer. The retarder may be a film type or a liquid crystal coating type, and may include $\lambda/2$ retarder and/or $\lambda/4$ retarder. The polarizer may also be a film type or a liquid crystal coating type.

In an exemplary embodiment, the antireflection panel RPP may include color filters. The color filters have a predetermined array. The arrangement of color filters may be determined considering the light emitting colors of the pixels included in the display panel DP. The antireflection panel RPP may further include a black matrix adjacent to the color filters.

In an exemplary embodiment, the antireflection panel RPP may include an offset structure. For example, the offset structure may include the first reflection layer and the second reflection layer disposed on different layers. The first reflection light and the second reflection light respectively reflected from the first reflection layer and the second reflection layer may cancel each other, thereby reducing the external light reflectance.

In an exemplary embodiment, the window panel WP may include a base film WP-BS and a light blocking pattern WP-BZ. The base film WP-BS may include glass substrate, synthetic resin film, or the like. The base film WP-BS is not limited to a single layer. The base film WP-BS may include two or more films combined with an adhesive member.

The light blocking pattern WP-BZ partially overlaps the base film WP-BS. The light blocking pattern WP-BZ may be disposed on the backside of the base film WP-BS to define the bezel region of the display device DD, i.e., the non-display region DD-NDA (see FIG. 1).

Although not shown separately, the window panel WP may further include a functional coating layer disposed on the top surface of the base film WP-BS. The functional coating layer may include an anti-fingerprint layer, an anti-reflection layer, a hard coat layer, or the like.

As shown in FIG. 2B, the display device DD may include a display panel DP, an input sensing layer ISL, an antireflection layer RPL, and a window layer WL. Adhesive members may be omitted from the display device DD, and then the input sensing layer ISL, the antireflection layer RPL, and the window layer WL may be formed in a continuous process on the base surface provided to the display panel DP. The stacking order of the input sensing layer ISL and antireflection layer RPL may be changed.

As shown in FIG. 2C, the display device DD may not include a separate antireflection unit. In an exemplary embodiment, the display device DD may include a display panel DP, an input sensing layer ISL-1, and a window panel WP. Here, the input sensing layer ISL-1 may further have an antireflection function.

In FIGS. 2A to 2C, the input sensing unit is shown as being overlapped with the display panel as a whole. However, this is an example, and the input sensing unit may instead overlap only a portion of the display region DD-DA, or may overlap only the non-display region DD-NDA. The input sensing unit may be a touch sensing panel for sensing a user's touch, or a fingerprint sensing panel for sensing fingerprint information of a user's finger. The pitch or the widths of the sensing electrodes described below may be changed depending on the use of the input sensing unit.

Figure 3:
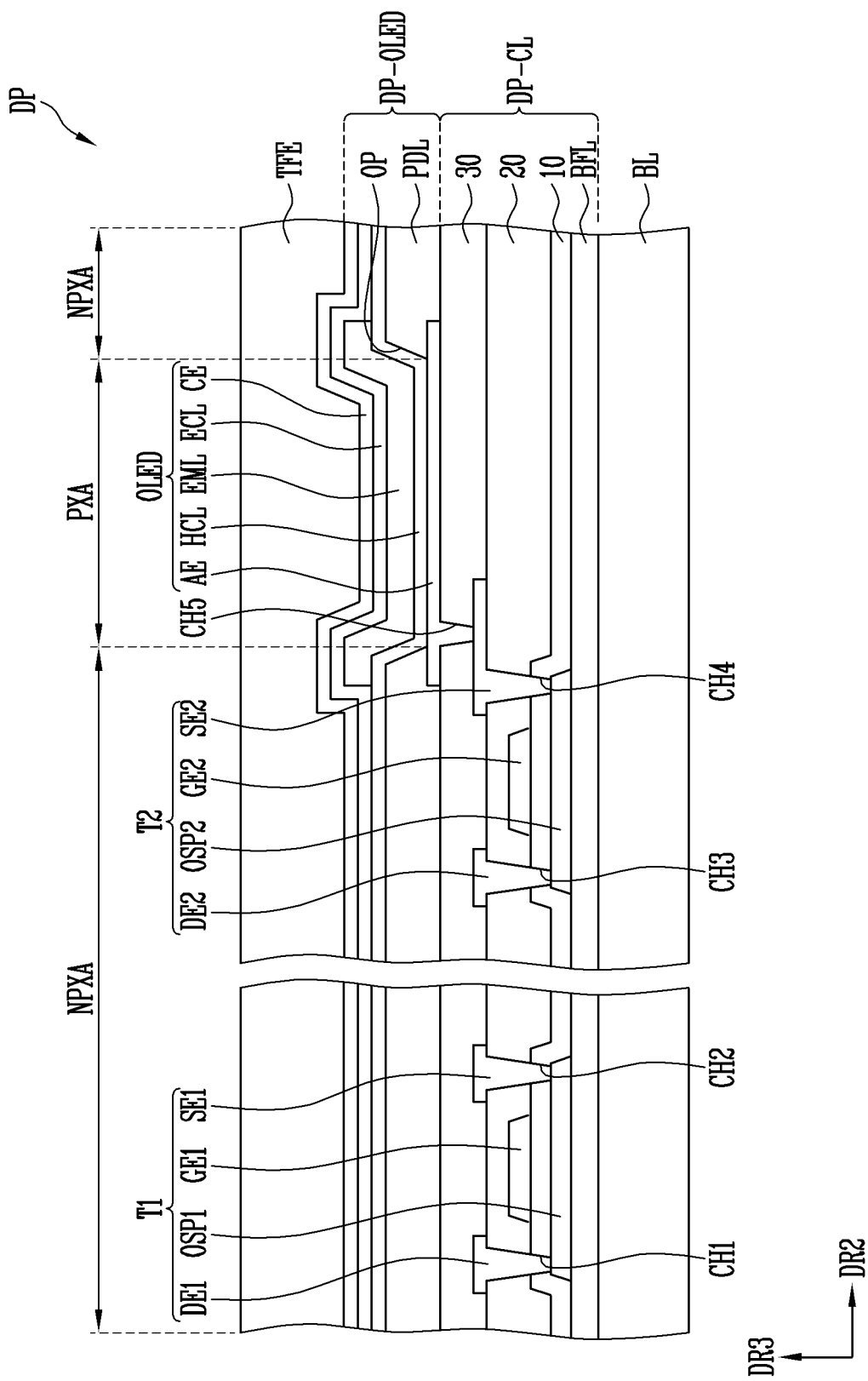
FIG. 3 is a cross-sectional view illustrating an example of a display panel included in a display device of FIG. 1.

FIG. 3 is a cross-sectional view illustrating an example of a display panel included in a display device of FIG. 1.

Referring to FIGS. 1 to 3, the display panel DP may include a base layer BL, a circuit element layer DP-CL, a display element layer DP-OLED, and an encapsulation layer TFE.

The base layer BL may include a synthetic resin film. The synthetic resin layer may be a polyimide-based resin layer, and the material thereof is not particularly limited. In addition, the base layer BL may include a glass substrate, a metal substrate, an organic/inorganic composite material substrate, or the like.

The circuit element layer DP-CL may include at least one insulation layer and circuit element. Hereinafter, the insulation layer included in the circuit element layer DP-CL is referred to as an intermediate insulation layer. The intermediate insulation layer may contain at least one intermediate inorganic layer and at least one intermediate organic layer. The circuit element may include signal lines, pixel driving circuits, and the like.

The circuit element layer DP-CL may include a buffer layer BFL, the first intermediate inorganic layer 10, and the second intermediate inorganic layer 20, which is an inorganic layer, and an intermediate organic layer 30 which is an organic layer. The material of the inorganic layer and the organic layer is not particularly limited. In an exemplary embodiment of the present invention, the buffer layer BFL may be disposed or omitted.

A semiconductor pattern of a first transistor T1 (hereinafter, a first semiconductor pattern OSP1) and a semiconductor pattern of a second transistor T2 (hereinafter, a second semiconductor pattern OSP2) are disposed on a buffer layer BFL. The first semiconductor pattern OSP1 and the second semiconductor pattern OSP2 may be formed of at least one selected from amorphous silicon, polysilicon, and metal oxide semiconductors.

A first intermediate inorganic layer 10 is disposed on the first semiconductor pattern OSP1 and the second semiconductor pattern OSP2. A control electrode of the first transistor T1 (hereinafter, a first control electrode GE1) and a control electrode of the second transistor T2 (hereinafter, a second control electrode GE2) are disposed on the first intermediate inorganic layer 10.

A second intermediate inorganic layer 20 covering the first control electrode GE1 and the second control electrode GE2 may be disposed on the first intermediate inorganic layer 10. An input electrode (hereinafter, a first input electrode DE1) and an output electrode (hereinafter, a first output electrode SE1) of the first transistor T1, and an input electrode (hereinafter, a second input electrode DE2) and an output electrode (hereinafter, a second output electrode SE2) of the second transistor T2 are disposed on the second intermediate inorganic layer 20.

The first input electrode DE1 and the first output electrode SE1 may be connected to the first semiconductor pattern OSP1 through a first contact hole CH1 and a second contact hole CH2 passing through the first intermediate inorganic layer 10 and the second intermediate inorganic layer 20, respectively. The second input electrode DE2 and the second output electrode SE2 may be connected to the second semiconductor pattern OSP2 through a third contact hole CH3 and a fourth contact hole CH4 passing through the first intermediate inorganic layer 10 and the second intermediate inorganic layer 20, respectively. In another exemplary embodiment of the present invention, at least one of the first transistor T1 and the second transistor T2 may be transformed into a bottom gate structure.

An intermediate inorganic layer 30 covering the first input electrode DE1, the second input electrode DE2, the first output electrode SE1, and the second output electrode SE2 are disposed on the intermediate inorganic layer 20. The intermediate organic layer 30 may provide a flat surface.

A display element layer DP-OLED is disposed on the intermediate organic layer 30. The display element layer DP-OLED may include a light emitting element. For example, the light emitting element may include an organic light emitting diode OLED.

The display element layer DP-OLED may include a pixel definition layer PDL and an organic light emitting diode OLED. The pixel definition layer PDL may include organic material. The first electrode AE may be disposed on the intermediate organic layer 30. The first electrode AE may be connected to the second output electrode SE2 through a fifth contact hole CH5 passing through the intermediate organic layer 30. An opening region OP is formed in the pixel definition layer PDL. The opening region OP of the pixel definition layer PDL may expose at least a portion of the first electrode AE. In an exemplary embodiment, the first electrode AE may be an anode of an organic light emitting diode OLED. However, this is an example, and the first electrode AE may be a cathode.

Pixels may be disposed in the display region DP-DA. The display region DP-DA may include a light emitting region PXA and a non-light emitting region NPXA adjacent to the light emitting region PXA. The non-light emitting region NPXA may surround the light emitting region PXA. The light emitting region PXA may correspond to the opening region OP of the pixel definition layer PDL. The non-light emitting region NPXA may correspond to the pixel definition layer PDL.

A hole control layer HCL may be disposed commonly to the light emitting region PXA and the non-light emitting region NPXA. Although not separately shown, a common layer, such as the hole control layer HCL, may be formed in common to the pixels.

The emission layer EML may be disposed on the hole control layer HCL. The emission layer EML may be disposed in a region corresponding to the opening region OP. The emission layer EML may generate a predetermined color light.

In an exemplary embodiment, the emission layer EML may be disposed commonly to the pixels PX. At this time, the emission layer EML may generate white light. In addition, the emission layer EML may have a multi-layer structure called a tandem.

The electron control layer ECL may be disposed on the emission layer EML. Although not shown separately, the electron control layer ECL may be formed in common to the pixels.

A second electrode CE is disposed on the electron control layer ECL. The second electrode CE is commonly disposed to the pixels PX. In an exemplary embodiment, the second electrode CE may be a cathode.

The encapsulation layer TFE may be disposed on the second electrode CE. The encapsulation layer TFE is commonly disposed to the pixels PX. The encapsulation layer TFE may seal the display element layer DP-OLED. The encapsulation layer TFE may include at least one insulation layer. The encapsulation layer TFE according to an exemplary embodiment of the present invention may include at least one inorganic layer (hereinafter, an encapsulation inorganic layer). In an exemplary embodiment, the encapsulation layer TFE may include at least one organic layer (hereinafter, an encapsulation organic layer) and at least one encapsulation inorganic layer.

The encapsulation inorganic layer may protect the display element layer DP-OLED from moisture or oxygen, and the encapsulation inorganic layer may protect the display element layer DP-OLED from foreign matter, such as dust particles. The encapsulation inorganic layer may include a silicon nitride layer, a silicon oxynitride layer, a silicon oxide layer, a titanium oxide layer, an aluminum oxide layer, or the like, but the inventive concepts are not limited thereto and the encapsulation inorganic layer may be formed of inorganic material capable of protecting the display element layer from moisture or oxygen. The encapsulation organic layer may include an acryl-based organic layer, but the inventive concepts are not limited thereto and encapsulation organic layer may be formed of an organic material capable of protecting the display element layer from foreign particles such as dust particles.

Figure 4:
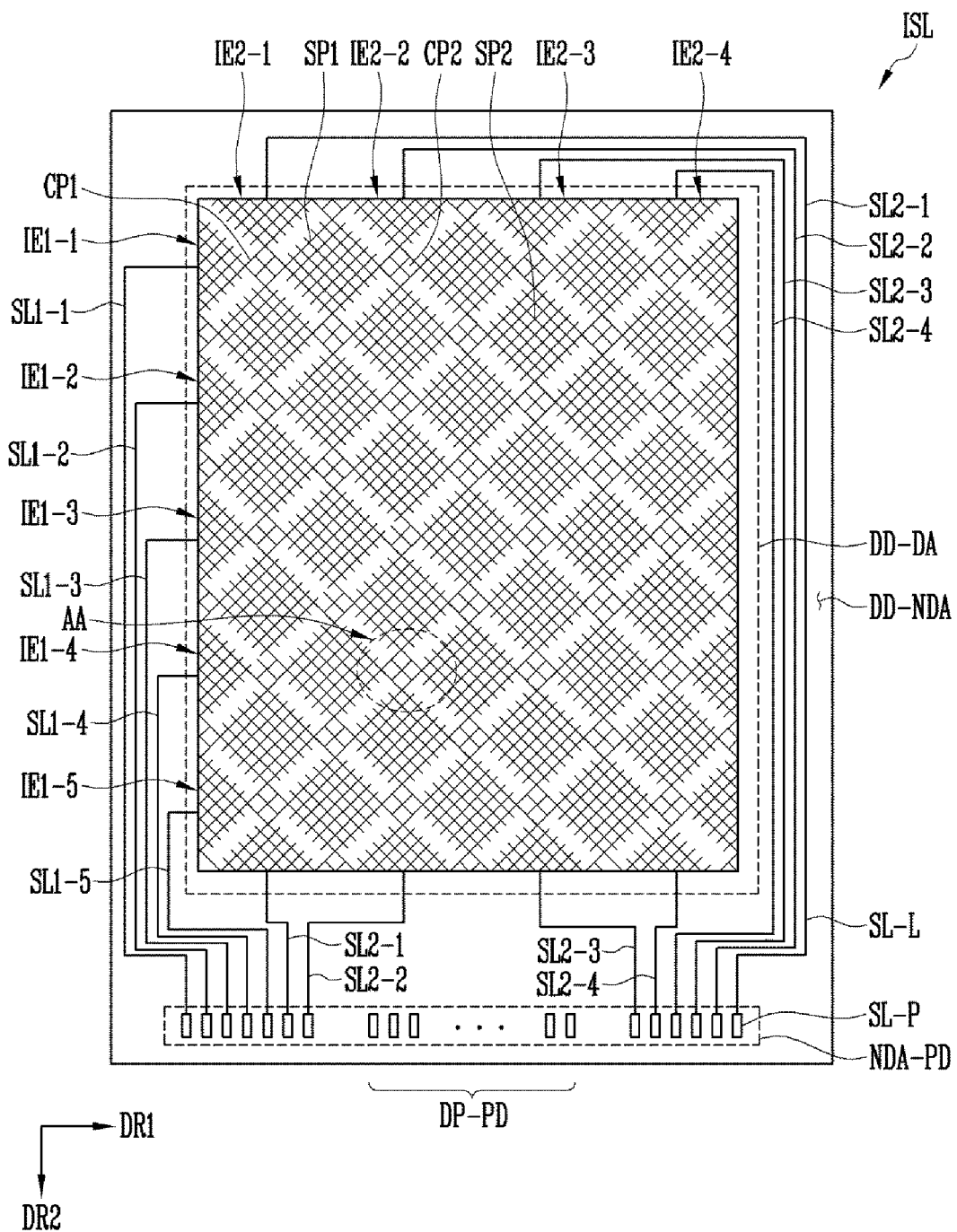
FIG. 4 is a plan view illustrating an example of an input sensing unit included in a display device of FIG. 1.

FIG. 4 is a plan view illustrating an example of an input sensing unit included in a display device of FIG. 1.

Referring to FIG. 4, the input sensing unit ISL may include first sensing electrodes IE1-1 to IE1-5, first signal lines SL1-1 to SL1-5 connected to first sensing electrodes IE1-1 to IE1-5, second sensing electrodes IE2-1 to IE2-4 and second sensing lines SL2-1 to SL2-4 connected to the second sensing electrodes IE2-1 to IE2-4.

In an exemplary embodiment, the input sensing unit ISL may further include an optical dummy electrode disposed in a boundary region between the first sensing electrodes IE1-1 to IE1-5 and the second sensing electrodes IE2-1 to IE2-4.

The first sensing electrodes IE1-1 to IE1-5 and the second sensing electrodes IE2-1 to IE2-4 may cross each other. The first sensing electrodes IE1-1 to IE1-5 are arranged in the second direction DR2, each of the first sensing electrodes IE1-1 to IE1-5 has a shape extending in the first direction DR1.

Each of the first sensing electrodes IE1-1 to IE1-5 includes first sensing cells SP1 and first connection parts CP1. Each of the second sensing electrodes IE2-1 to IE2-4 includes second sensing cells SP2 and second connection parts CP2.

In an exemplary embodiment, as shown in FIG. 4, the first sensing electrodes IE1-1 to IE1-5 and the second sensing electrodes IE2-1 to IE2-4 may be formed in a mesh pattern. Thus, the parasitic capacitance between these electrodes and the electrodes of the display panel DP (see FIG. 2) may be reduced.

The first sensing electrodes IE1-1 to IE1-5 and the second sensing electrodes IE2-1 to IE2-4 are not visible to the user of the display device DD because they do not overlap the light emitting regions.

The first sensing electrodes IE1-1 to IE1-5 and the second sensing electrodes IE2-1 to IE2-4 having the mesh shape may include silver, aluminum, copper, chromium, nickel, titanium, or the like, but the inventive concepts are not limited thereto.

Within one first sensing electrode, the first sensing cells SP1 may be arranged in the first direction DR1 and within one second sensing electrode, the second sensing cells SP2 may be arranged in the second direction DR2. Each of the first connection parts CP1 may be connected to the adjacent first sensing cells SP1, and each of the second connection parts CP2 may be connected to the adjacent second sensing cells SP2.

In an exemplary embodiment, the first connection parts CP1, the first sensing cells SP1, and the second sensing cells SP2 may be disposed on the same layer, and the second connection parts CP2 may be disposed at a different layer from the first connection parts CP1, the first sensing cells SP1 and the second sensing cells SP2. Accordingly, the first sensing electrodes IE1-1 to IE1-5 and the second sensing electrodes IE2-1 to IE2-4 are not short-circuited with each other.

Each of the first signal lines SL1-1 to SL1-5 may be connected to one end of each of the first sensing electrodes IE1-1 to IE1-5, respectively. The second signal lines SL2-1 to SL2-4 may be connected to both ends of the second sensing electrodes IE2-1 to IE2-4. In an exemplary embodiment, the first signal lines SL1-1 to SL1-5 may be connected to both ends of the first sensing electrodes IE1-1 to IE1-5. In an exemplary embodiment, each of the second signal lines SL2-1 to SL2-4 may be connected only to one end of each of the second sensing electrodes IE2-1 to IE2-4, respectively.

The first signal lines SL1-1 to SL1-5 and the second signal lines SL2-1 to SL2-4 may include a line part SL-L and a pad part SL-P. The pad portions SL-P may be arranged to the pad regions NDA-PD.

The input sensing unit ISL may include signal pads DP-PD. The signal pads DP-PD may be arranged to the pad region NDA-PD.

However, this is merely an example, and the plane shape of the input sensing unit ISL is not limited thereto.

Figure 5:
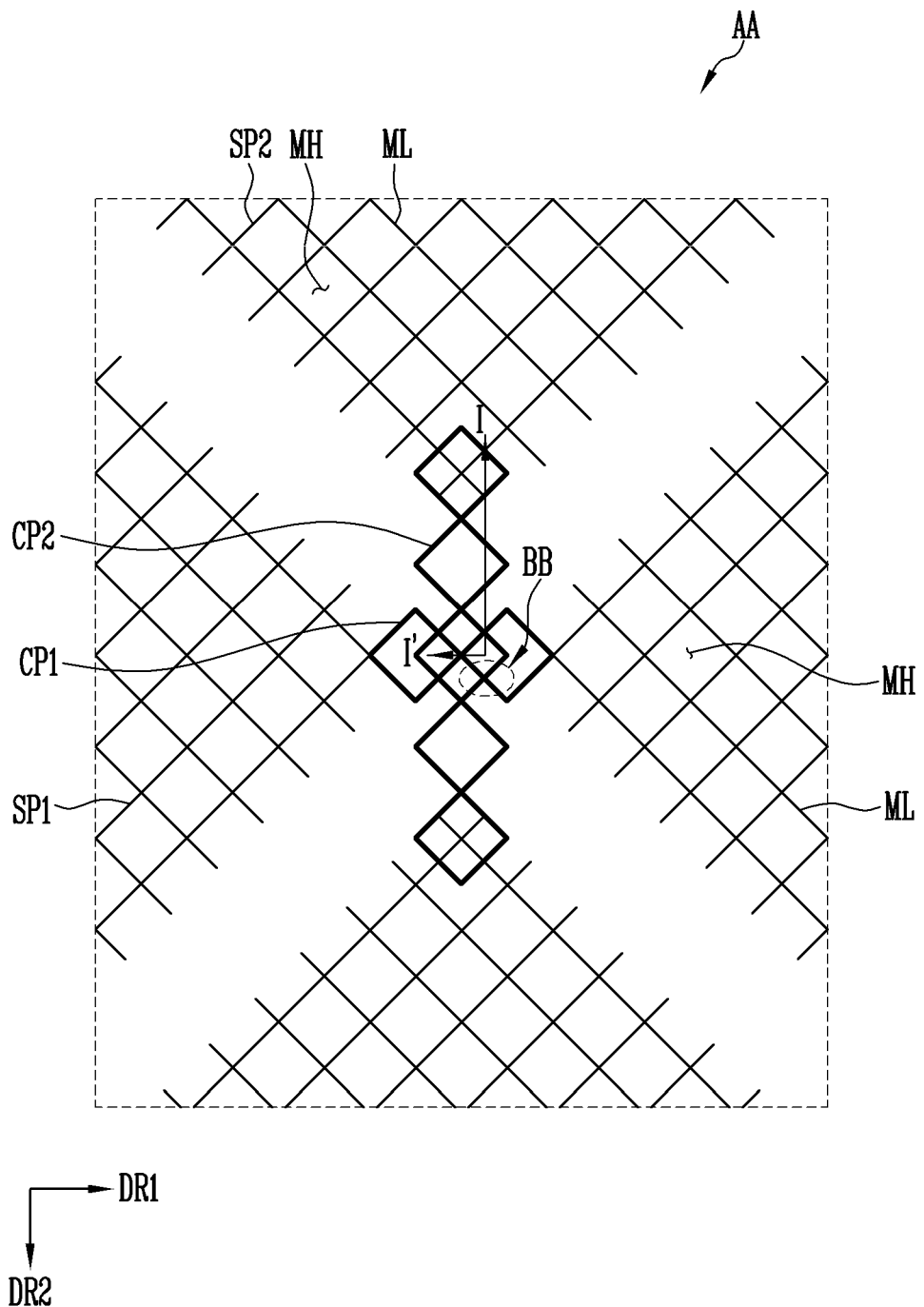
FIG. 5 is an enlarged view illustrating an example of the AA portion of an input sensing unit of FIG. 4.

FIG. 5 is an enlarged view illustrating an example of the AA portion of an input sensing unit of FIG. 4.

Referring to FIGS. 4 and 5, each of the first sensing cell SP1, the second sensing cell SP2, the first connection part CP1, and the second connection part CP2 may include a plurality of mesh lines ML defining a plurality of mesh holes MH.

Each line width of the mesh lines ML may be several micrometers. A crossing portion of each of the mesh lines ML may have a line width less than the other portion. In an exemplary embodiment, each of the first sensing cell SP1, the second sensing cell SP2, the first connection part CP1 and the second connection part CP2 may overlap the non-light emitting region (shown as NPXA in FIG. 3) of the display panel DP.

In an exemplary embodiment, the first signal lines SL1-1 to SL1-5 and the second signal lines SL2-1 to SL2-4 may also have a mesh shape.

Each of the mesh holes MH may correspond one-to-one to the light emitting region (shown as PXA in FIG. 3), or may correspond to a plurality of light emitting regions PXA. The area of the mesh holes MH may have different areas as needed.

The first sensing cell SP1 and the second sensing cell SP2 may be formed so as not to be in contact with each other.

In an exemplary embodiment, the first connection part CP1 and the second connection part CP2 may cross each other. For example, the first connection part CP1 and the second connection part CP2 may cross each other while being insulated from each other, with the insulation layer interposed therebetween. As shown in FIG. 5, there exists a portion where the mesh line ML of the first connection part CP1 and the mesh line ML of the second connection part CP2 cross (or overlap) each other. For the sake of clarity, the first connection part CP1 and the second connection part CP2 are shown in bold in FIG. 5, but the arrangement of the first connection part CP1 and the second connection part CP2 is not limited thereto. For example, the first connection part CP1 and the second connection part CP2 may not cross each other.

Figure 6:
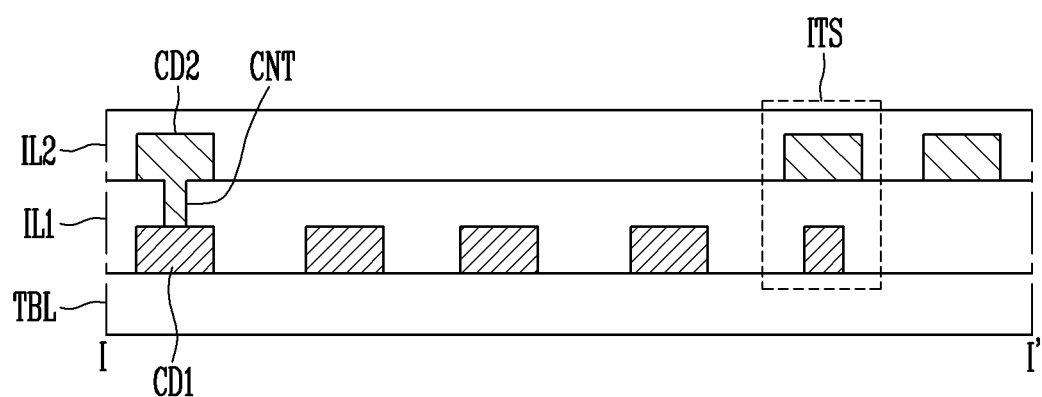
FIG. 6 is a cross-sectional view schematically illustrating an example of an I-I' portion of an input sensing unit of FIG. 5.

FIG. 6 is a cross-sectional view schematically illustrating an example of an I-I' portion of an input sensing unit of FIG. 5.

Referring to FIGS. 1 to 6, the input sensing unit ISL may include a base layer TBL, a first conductive pattern CD1, a second conductive pattern CD2, a first insulation layer IL1 and a second insulation layer IL2.

In an exemplary embodiment, the display panel DP may be disposed under the input sensing unit ISL.

In an exemplary embodiment, the base layer TBL may be the top layer of the encapsulation layer TFE of the display panel DP. For example, the base layer TBL may be an inorganic layer (or an inorganic insulation layer), which is the top layer of the encapsulation layer TFE. In an exemplary embodiment, the base layer TBL may be an inorganic layer (or an inorganic buffer layer) that is additionally disposed on the encapsulation layer TFE. For example, the base layer TBL may include a silicon nitride layer, a silicon oxynitride layer, a silicon oxide layer, a titanium oxide layer, an aluminum oxide layer, or the like.

The first conductive pattern CD1 may be disposed directly on the base layer TBL. In an exemplary embodiment, the first conductive pattern CD1 may be disposed overlapping the pixel definition layer PDL.

In an exemplary embodiment, the first conductive pattern CD1 may form the second connection parts CP2. In this case, the second conductive pattern CD2 may form the first sensing cells SP1, the first connection parts CP1, and the second sensing cells SP2.

In an exemplary embodiment, the first conductive pattern CD1 may form the first sensing cells SP1, the first connection parts CP1, and the second sensing cells SP2. In this case, the second conductive pattern CD2 may form the second connection parts CP2.

An exemplary embodiment of the present invention will be described under the condition that first conductive pattern CD1 forms the second connection parts CP2.

The first conductive pattern CD1 may have a mesh pattern with a plurality of mesh holes. In an exemplary embodiment, the first conductive pattern CD1 may be formed overlapping the pixel definition layer PDL by patterning with a mask.

The first insulation layer IL1 covers the first conductive pattern CD1 and may be disposed on the base layer TBL. The first insulation layer IL1 may have a single layer or a multi-layer structure. The first insulation layer IL1 may include an inorganic or organic material or a composite material.

A contact hole CNT which partially exposes the first conductive pattern CD1 may be formed in the first insulation layer IL1.

In an exemplary embodiment, the first insulation layer IL1 may include a color filter and a black matrix.

The second conductive pattern CD2 may be disposed on the first insulation layer IL1. A portion of the second conductive pattern CD2 may be connected to the first conductive pattern CD1 through a contact hole CNT. The second conductive pattern CD2, which is connected to the first conductive pattern CD1, may be defined as the second sensing cell SP2.

A portion of the second conductive pattern CD2 may cross the first conductive pattern CD1. The second conductive pattern CD2 crossing or overlapping the first conductive pattern CD1 may be defined as the first connection part CP1.

The region crossing the first conductive pattern CD1 and the second conductive pattern CD2 may be defined as the crossing region ITS. In the crossing region ITS, the first conductive pattern CD1 and the second conductive pattern CD2 are not connected. That is, the crossing region ITS is the region where the first conductive pattern CD1 and the second conductive pattern CD2 are not connected. For example, the crossing region ITS may include the first connection part CP1 and the second connection part CP2.

In an exemplary embodiment, as shown in FIG. 6, the line width of the first conductive pattern CD1 included in the crossing region ITS may be less than the line width in the other region. Also, the line width of the first conductive pattern CD1 (i.e., the second connection part CP2) included in the crossing region ITS may be less than the line width of the second conductive pattern CD2 (i.e., the first connection part CP1).

In the process of forming each of conductive lines and/or electrodes included in the display panel DP under the input sensing unit ISL, conductive particles, such as silver (Ag) or the like, are precipitated out and deposited, thereby contaminating an upper deposition structure. For example, conductive particles generated during a lower line process may be inadvertently deposited on the first conductive pattern CD1 and/or the second conductive pattern CD2 included in the crossing region ITS.

Thus, a micro resistance is formed between the first conductive pattern CD1 and the second conductive pattern CD2 in the crossing region ITS, which effectively lowers the sensitivity of the input sensing unit ISL, or the first conductive pattern CD1 and the second conductive pattern CD2 may be short-circuited and a detection failure may occur.

A display device according to an exemplary embodiment of the present invention can prevent a contamination from the conductive particles by minimizing an overlapping area between the first conductive pattern CD1 and the second conductive pattern CD2 in the crossing region ITS. This will be described in detail with reference to FIG. 7A and subsequent drawings.

In an exemplary embodiment, the second conductive pattern CD2 may have a mesh pattern with a plurality of mesh holes. The second conductive pattern CD2 may be formed on the first insulation layer IL1 by patterning with a mask.

Each of the first conductive pattern CD1 and the second conductive pattern CD2 may have a single layer or multi-layer structure. A conductive pattern of the single layer structure may include a metal layer or a transparent conductive layer. The metal layer may include at least one selected from molybdenum, silver, titanium, copper, aluminum, and alloys thereof. The transparent conductive layer may include a transparent conductive oxide such as indium tin oxide (ITO), indium zinc oxide (IZO), zinc oxide (ZnO), indium tin zinc oxide (ITZO). In addition, the transparent conductive layer may include conductive polymers, such as PEDOT, metal nanowire, grapheme, or the like. Multi-layered metal layers may have a three-layer structure, for example titanium/aluminum/titanium.

The second insulation layer IL2 may be disposed on the first insulation layer IL1 to cover the second conductive pattern CD2. The second insulation layer IL2 may have a single layer or multi-layer structure. The second insulation layer IL2 may include an inorganic or organic material or a composite material.

In an exemplary embodiment, at least one of the first insulation layer IL1 and second insulation layer IL2 may be a polymer layer, for example, an acryl polymer layer, in order to improve flexibility.

In an exemplary embodiment, the second insulation layer IL2 may include a black matrix and a color filter for antireflection functions.

FIGS. 7A to 7D are enlarged views schematically illustrating examples of a BB portion of an input sensing unit of FIG. 5.

Referring to FIGS. 3 to 7D, the input sensing unit ISL may include first conductive pattern CD1 and second conductive pattern CD2 overlapping each other. In an exemplary embodiment, the first conductive pattern CD1 may include a second connection part CP2, and the second conductive pattern CD2 may include a first sensing cell SP1, a second sensing cell SP2, and a first connection part CP1. That is, the second connection part CP2 may be disposed under the first connection part CP1.

Each of the first conductive pattern CD1 and second conductive pattern CD2 shown in FIGS. 7A to 7D may be a portion of a mesh line.

In an exemplary embodiment, the first connection part CP1 and the second connection part CP2 may overlap in the crossing region ITS.

The first conductive pattern CD1 (i.e., a second connection part CP2) may include a first portion PO1 and a second portion PO2 extending the first portion PO1. The first portion PO1 may be included in the crossing region ITS and the second portion PO2 may be formed outside the crossing region ITS. Likewise, the second conductive pattern CD2 (i.e., a first connection part CP1) may include a third portion PO3 and a fourth portion PO4 extending the third portion PO3. The third portion PO3 may be included in the crossing region ITS and the fourth portion PO4 may be formed outside the crossing region ITS. Hereinafter, in FIGS. 7A to 9B, the first conductive pattern CD1 is the second connection part CP2 and the second conductive pattern CD2 is the first connection part CP1.

In an exemplary embodiment, the second portion PO2 of the second connection part CP2 does not overlap the second conductive pattern CD2 including the first connection part CP1. Also, the fourth portion PO4 of the first connection part CP1 does not overlap the first conductive pattern CD1 (i.e., a second connection part CP2).

In an exemplary embodiment, the area of the portion where the second connection CP2 overlaps the second sensing cell SP2 may be the same as the area of the other portion. Since the second connection part CP2 and the second sensing cell SP2 are electrically connected, there is no significant influence on an input sensing drive even if a portion connected to each other by the conductive particles generated.

In an exemplary embodiment, the width W1 of the first portion of the second connection part CP2 may be less than the width W2 of the second portion. Here, as shown in FIGS. 7A to 7D, each of the widths of the first and second connection parts CP1 and CP2 may be defined as the width (distance) in a direction perpendicular to the direction in which the mesh line extends. For example, the second width W2 may be about 4 um, and the first width W1 may be about 1 um to about 2.5 um.

Here, the first width W1 may be a width of the portion of the second connection part CP2 overlapping the first connection part CP1. The second width W2 may be a width of the second connection part CP2 outside the crossing region ITS.

The second width W2 may be about 4 um and the first width W1 may be about 2 um. However, a width (or a line width) of the mesh line of the second connection part CP2 is not limited thereto. A ratio between the first width W1 and the second width W2 may be set to a predetermined critical ratio range. For example, the first width W1 may range from about 30% to about 60% of the second width W2.

A width of the second portion PO2 of the second connection part CP2 may be substantially uniform. For example, a portion of the second portion PO2 may overlap the second sensing cell SP2. A width of the second connection part CP2 overlapping the second sensing cell SP2 may be substantially equal to the second width W2.

In an exemplary embodiment, a width of the third portion PO3 of the first connection part CP1 and a width of the fourth portion PO4 may be substantially equivalent. For example, the first connection part CP1 may have a width equal to the second width W2, and the first width W1 may be less than the second width W2. If a width of the second connection part CP2 overlapping the first connection part CP1 is reduced to half of the conventional width of the second connection part CP2, an area of the overlapping region of the first connection part CP1 and the second connection part CP2 may be reduced to half.

Figure 7A:
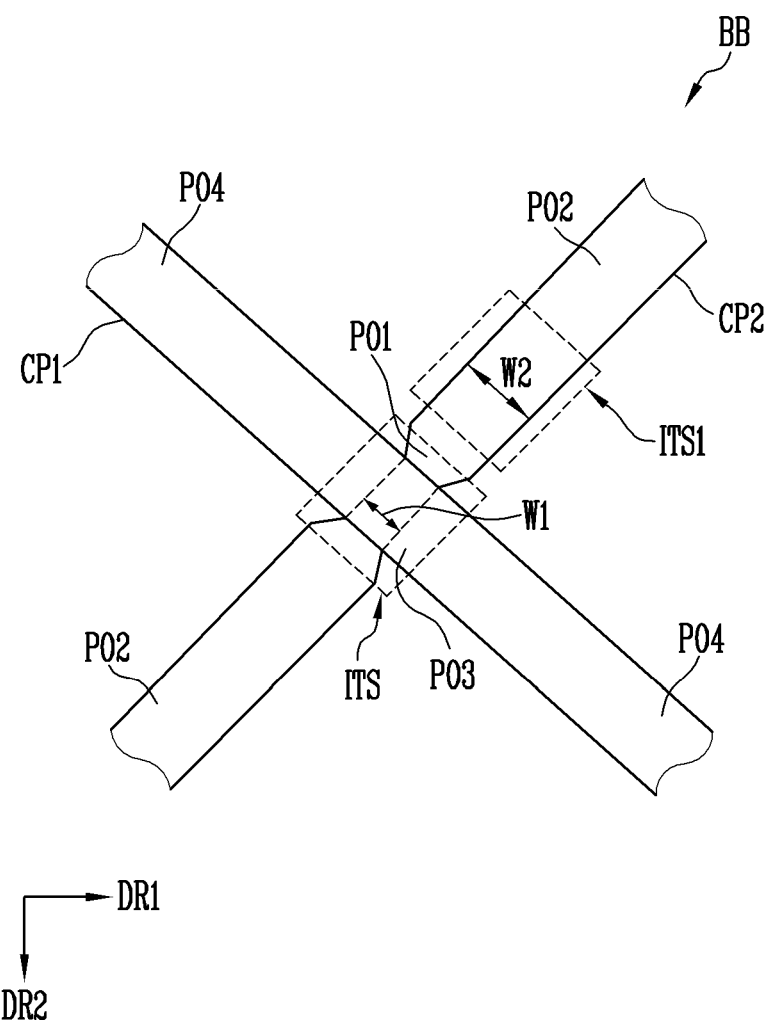

As shown in FIG. 7A, the second connection part CP2 may have a notch shape in the first portion PO1. For example, the notch may be formed in the direction in which the mesh line of the second connection CP2 extends at at least one side boundary of the second connection part CP2, and the extension of the second connection part CP2. That is, the second connection part CP2 may include a sloped boundary in the direction in which the mesh line of the second connection CP2 extends in the first portion PO1. Here, a width of the region overlapping the first connection part CP1 of the first portion PO1 may be substantially uniform. Therefore, a plane shape of the region where the first connection part CP1 and the second connection part CP2 overlap may be a substantially quadrangle shape.

In an exemplary embodiment, an area of the first portion PO1 of the second connection part CP2 included in the crossing region ITS may be less than an area of the second portion PO2 included in the unit region ITS1 of the same size as the crossing region ITS. Therefore, an overlapping area of the first connection part CP1 and the second connection part CP2 in the crossing region ITS may be reduced.

Therefore, the possibility that conductive particles are deposited on the first connection part CP1 and the second connection part CP2 may be reduced and a micro resistance and a short circuit incidence due to the conductive particles may be reduced. Therefore, the process failure rate of the input sensing unit ISL and the display device DD may be improved.

Figure 7B:
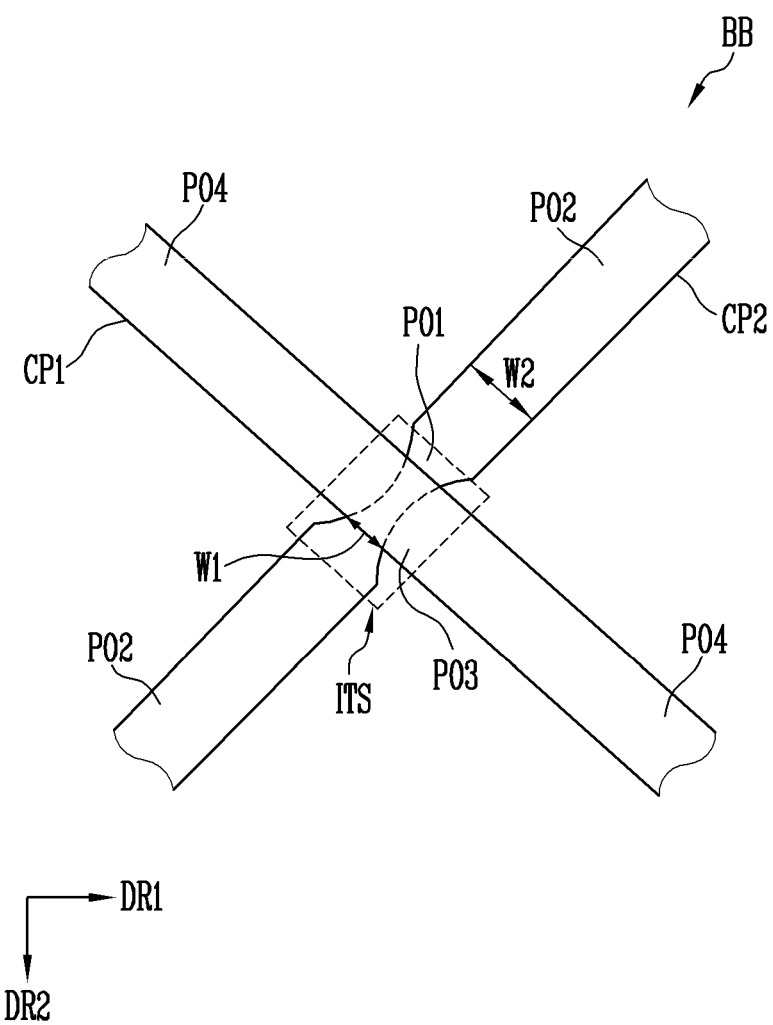

In an exemplary embodiment, the width W1 of the first portion PO1 of the second connection part CP2 may become smaller toward the center of the crossing region ITS. In an exemplary embodiment, as shown in FIG. 7B, the second connection portion CP2 may have a concave shape toward the center of the crossing region ITS in the first portion PO1. For example, a boundary of the second connection part CP2 in the crossing region ITS may have a concave predetermined curvature toward the center of the crossing region ITS. Alternatively, in an exemplary embodiment, as shown in FIG. 7C, the side boundary of the second connection part CP2 in the crossing region ITS may have a 'V' shape having a predetermined angle for the 'V'.

Figure 7D:
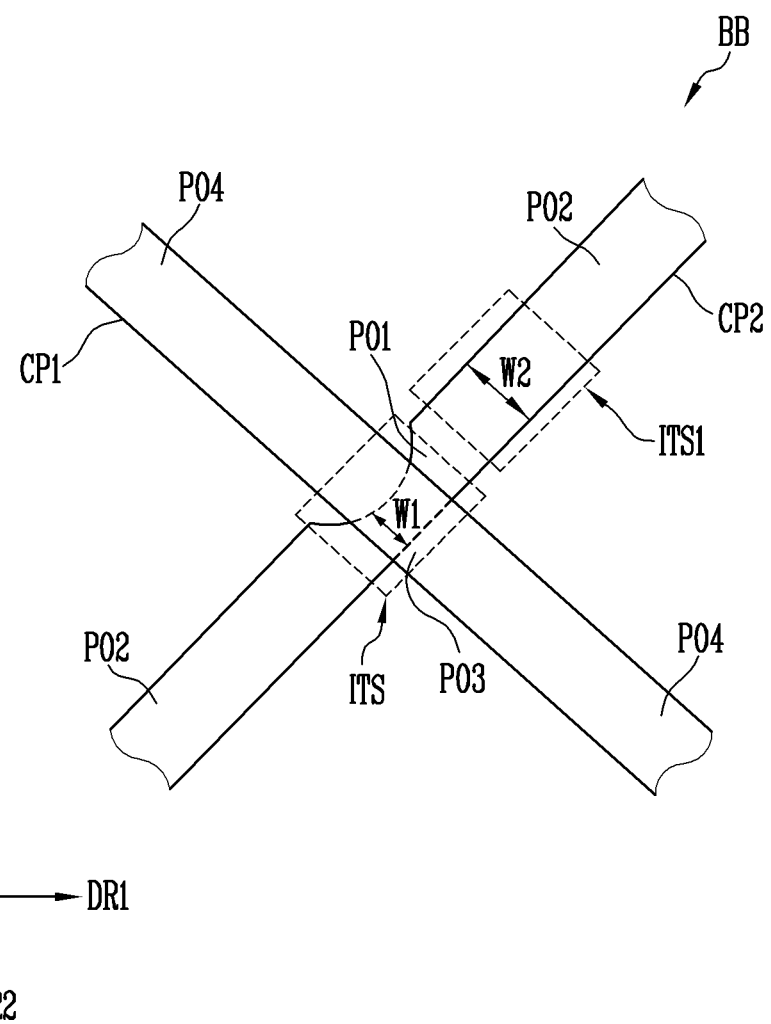

In FIGS. 7A to 7C, the opposite boundaries of the first portion PO1 are shown as symmetrical, but the shape of the boundaries of the first portion PO1 is not limited thereto. For example, as shown in FIG. 7D, one side boundary of the first portion PO1 may be formed with straight line parallel to the boundary of the second portion PO2, but the other side boundary thereof may be formed with predetermined curvature.

However, this is merely an example, and the plane shape of the first portion PO1 is not limited thereto. The first portion PO1 may be any plane shape that can minimize the area overlapping the first connection part CP1.

Thus, an area of the first portion PO1 of the second connection part CP2 included in the crossing region ITS may be less than an area of the second portion PO2 included in the unit region ITS1 of the same size as the crossing region ITS. Therefore, an overlapping area of the first connection part CP1 and the second connection part CP2 in the crossing region ITS may be reduced.

Figure 8:
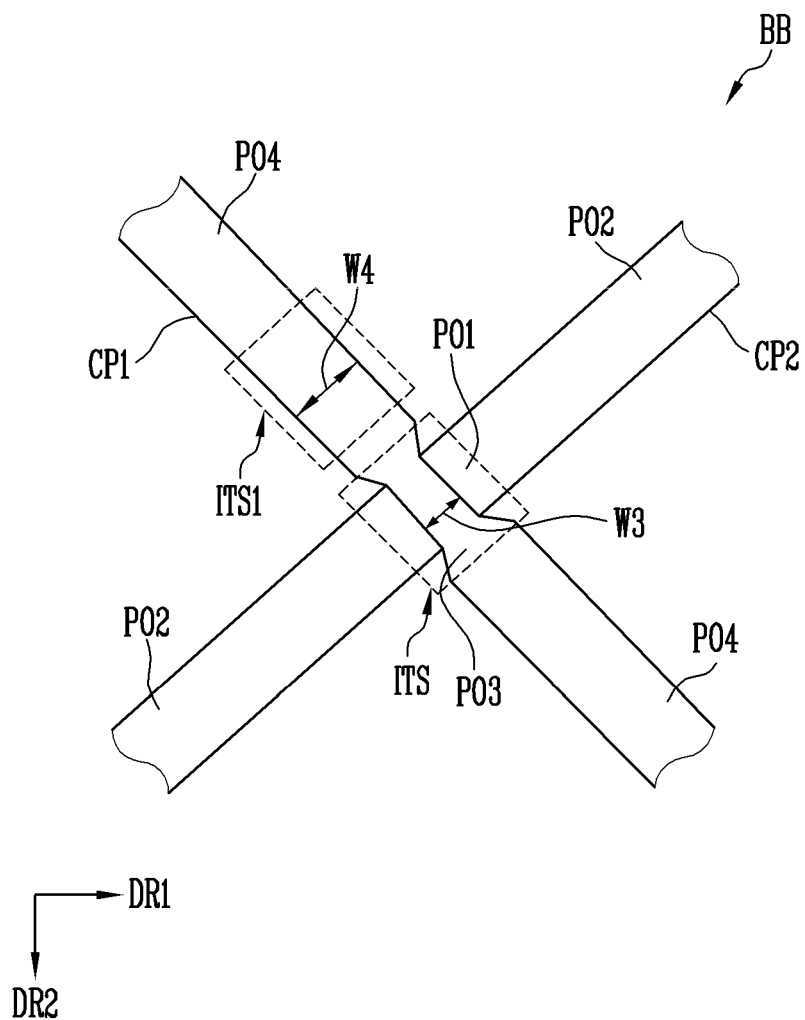
FIG. 8 is an enlarged view schematically illustrating an example of a BB portion of an input sensing unit of FIG. 5.
Figure 9A:
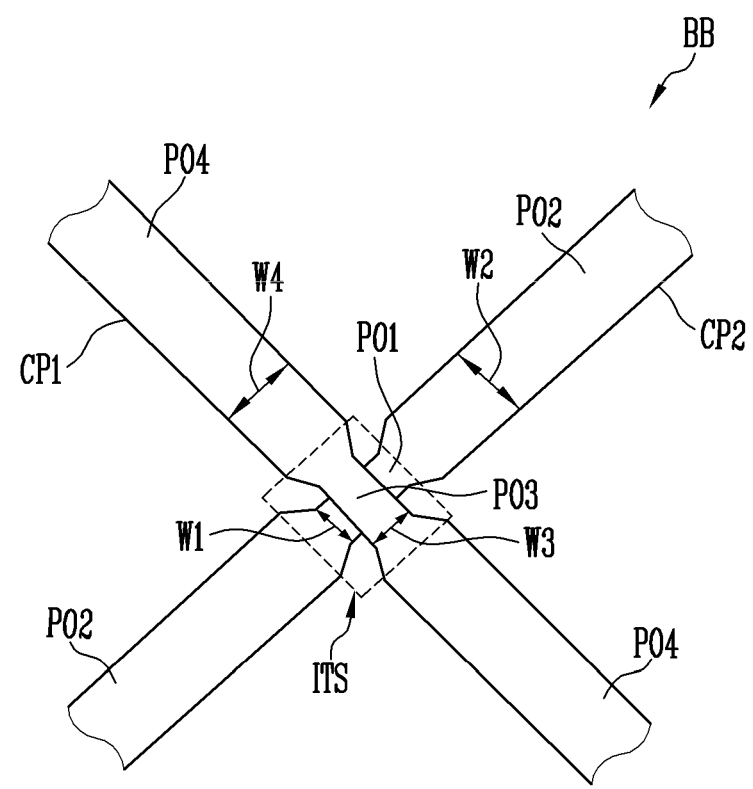

FIG. 8 is an enlarged view schematically illustrating an example of a BB portion of an input sensing unit of FIG. 5, and FIGS. 9A and 9B are enlarged views schematically illustrating examples of a BB portion of an input sensing unit of FIG. 5.

In FIGS. 8 to 9B, the same reference numerals are used for the components described with reference to FIG. 7A, and a redundant description of these components will be omitted. In addition, the input sensing unit of FIGS. 8 to 9B may have substantially the same or similar configuration as the display device DD of FIG. 1, except for the shapes of the first and second connection parts CP1 and CP2 in the crossing region.

Referring to FIGS. 3 to 9B, the input sensing unit ISL may include a first conductive pattern CD1 and a second conductive pattern CD2 overlapping each other. The first conductive pattern CD1 may include a second connection part CP2, and the second conductive pattern CD2 may include a first sensing cell SP1, a second sensing cell SP2, and a first connection part CP1.

Each of the first connection part CP1 and the second connection part CP2 shown in FIGS. 8 to 9B is a portion of the mesh line and may overlap each other in the crossing region ITS.

As shown in FIG. 8, a width of the first portion PO1 of the second connection part CP2 may be the same as a width of the second portion PO2, and a width W3 of the third portion PO3 of the first connection part CP1 may be less than a width W4 of the fourth portion PO4. In an exemplary embodiment, a side boundary of the third portion PO3 of the second connection part CP2 may have a notch shape. For example, the notch may be formed in the direction in which the mesh line of the first connection part CP1 extends at at least one side boundary of the first connection part CP1, and the extension of the second connection part CP2

However, this is merely an example, and the plane shape of the third portion PO3 is not limited thereto. The third portion PO3 may be any plane shape that can minimize the area overlapping the second connection part CP2.

The fourth width W4 may be about 4 um, and the third width W3 may be about 1 um to about 2.5 um. However, a width (or a line width) of the mesh line of the first connection part CP1 is not limited thereto. A ratio between the third width W3 and the fourth width W4 may be set to a predetermined critical ratio range. For example, the third width W3 may range from about 30% to about 60% of the fourth width W4.

Here, the third width W3 may be a width of the portion of the first connection part CP1 overlapping the second connection part CP2. The fourth width W4 may be a width of the first connection part CP1 outside the crossing region ITS.

A width of the second portion PO2 of the second connection part CP2 may be substantially uniform. In an exemplary embodiment, a width of the third portion PO3 of the first connection part CP1 and a width of the fourth portion PO4 may be substantially equivalent. For example, the first connection part CP1 may have a width equal to the second width W2, and the first width W1 may be less than the second width W2.

An area of the third portion PO3 of the first connection part CP1 included in the crossing region ITS may be less than an area of the fourth portion PO4 included in the unit region ITS1 of the same size as the crossing region ITS. Therefore, an overlapping area of the first connection part CP1 and the second connection part CP2 in the crossing region ITS may be reduced.

If the width (i.e., the third width W3) of the first connection part CP1 overlapping the second connection part CP2 is reduced to half of the conventional width of the second connection part CP2, an area of the overlapping region of the first connection part CP1 and the second connection part CP2 may be reduced to half of the conventional area thereof.

As shown in FIGS. 9A and 9B, the width of the first portion PO1 of the second connection part CP2 may be less than the width of the second portion PO2, and the width of the third portion PO3 of the first connection part CP1 may be less than the width of the fourth portion PO4.

In an exemplary embodiment, each of the first connection part CP1 and the second connection part CP2 may have a notch shape in the crossing region ITS. The width of the first connection part CP1 (i.e., the third portion PO3) and the width of the second connection part CP2 (i.e., the first portion PO1) may be uniform, respectively, at a portion overlapping between the first connection part CP1 and the second connection part CP2. Therefore, a plane shape of the region where the first connection part CP1 and the second connection part CP2 overlap may be a substantially quadrangle shape.

An area of the first portion PO1 of the second connection part CP2 or an area of the third portion PO3 of the first connection part CP1 included in the crossing region ITS may be less than an area of the second portion PO2 included in the unit region ITS1 of the same size as the crossing region ITS. Therefore, an overlapping area of the first connection part CP1 and the second connection part CP2 in the crossing region ITS may be reduced.

For example, if the width of the second connection part CP2 and the width of the first connection part CP1 are reduced to half of the conventional width thereof, an area of the overlapping region of the first connection part CP1 and the second connection part CP2 may be reduced to about ¼ of the conventional area thereof. That is, an area of the overlapping region of the first connection part CP1 and the second connection part CP2 may be reduced more than twice as much as the exemplary embodiments shown in FIGS. 7A to 8.

Therefore, the possibility that conductive particles are deposited on the first connection part CP1 and the second connection part CP2 may be reduced, and a micro resistance and a short circuit incidence due to the conductive particles may be reduced. Therefore, the process failure rate of the input sensing unit ISL and the display device DD may be improved.

As the width of the second connection part CP2 and the width of the first connection part CP1 decreases in the crossing region ITS, the area of the overlapping region of the first connection part CP1 and the second connection part CP2 may decrease and the possibility that conductive particles are deposited may be reduced on the overlapping region of the first connection part CP1 and the second connection part CP2.

In an exemplary embodiment, the width of the first portion PO1 of the second connection part CP2 and the width of the third portion PO3 of the first connection part CP1 may become smaller toward the center of the crossing region ITS. As shown in FIG. 9B, the side boundary of the second connection part CP2 in the crossing region ITS may have a 'V' shape having a predetermined angle for the 'V'.

However, this is merely an example, and the plane shape of the first portion PO1 and the third portion PO3 is not limited thereto. The first portion PO1 and the third portion PO3 may be any plane shape that can minimize the area overlapping each other.

As described above, an overlapping area of the first connection part CP1 and the second connection part CP2 in the crossing region ITS may be reduced so that a micro resistance and a short circuit incidence due to the conductive particles generated in manufacturing process of the display panel in the input sensing unit ISL may be reduced. Therefore, the process failure rate of the input sensing unit ISL and the display device DD may be improved.

Figure 10:
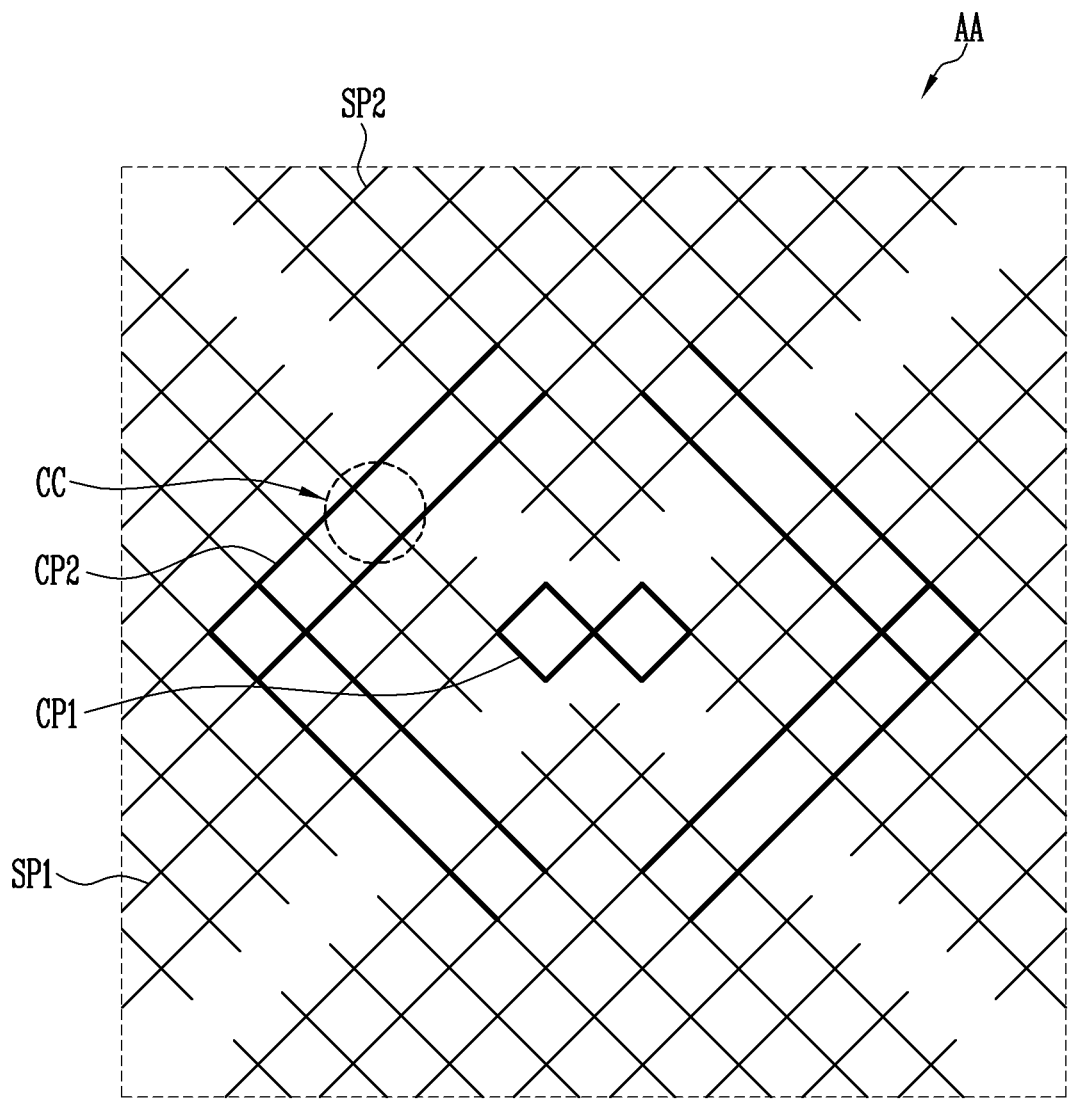
FIG. 10 is an enlarged view showing illustrating an example of an AA portion of an input sensing unit of FIG. 4.
Figure 10:
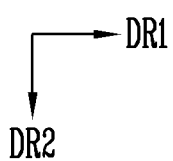

FIG. 10 is an enlarged view showing illustrating an example of an AA portion of an input sensing unit of FIG. 4.

In FIG. 10, the same reference numerals are used for the components described with reference to FIG. 5, and a redundant description of these components will be omitted. In addition, the input sensing unit of FIG. 10 may have substantially the same or a similar configuration as the input sensing unit of FIG. 5, except for the disposal of the second connection part CP2.

Referring to FIGS. 4, 5 and 10, each of the first sensing cell SP1, the second sensing cell SP2, the first connection part CP1, and the second connection part CP2 may include a plurality of mesh lines ML defining a plurality of mesh holes MH.

Each line width of the mesh lines ML may be several micrometers. A crossing portion of each of the mesh lines ML may have a line width less than that of the other portion.

The first sensing cell SP1 and the second sensing cell SP2 may be formed so as not to be in contact with each other.

In an exemplary embodiment, the second connection part CP2 and the first sensing cell SP1 may cross (or overlap) each other. Also, the first connection part CP1 and the second connection part CP2 may not cross each other. For example, the first sensing cell SP1 and the second connection part CP2 may cross each other while being insulated from each other, with the insulation layer interposed therebetween.

As shown in FIG. 10, there exists a portion where the mesh line ML of the first sensing cell SP1 and the mesh line ML of the second connection part CP2 cross (or overlap) each other. For the sake of clarity, the first connection part CP1 and the second connection part CP2 are shown in bold in FIG. 10, but the arrangement of the first connection part CP1 and the second connection part CP2 is not limited thereto.

Figure 11A:
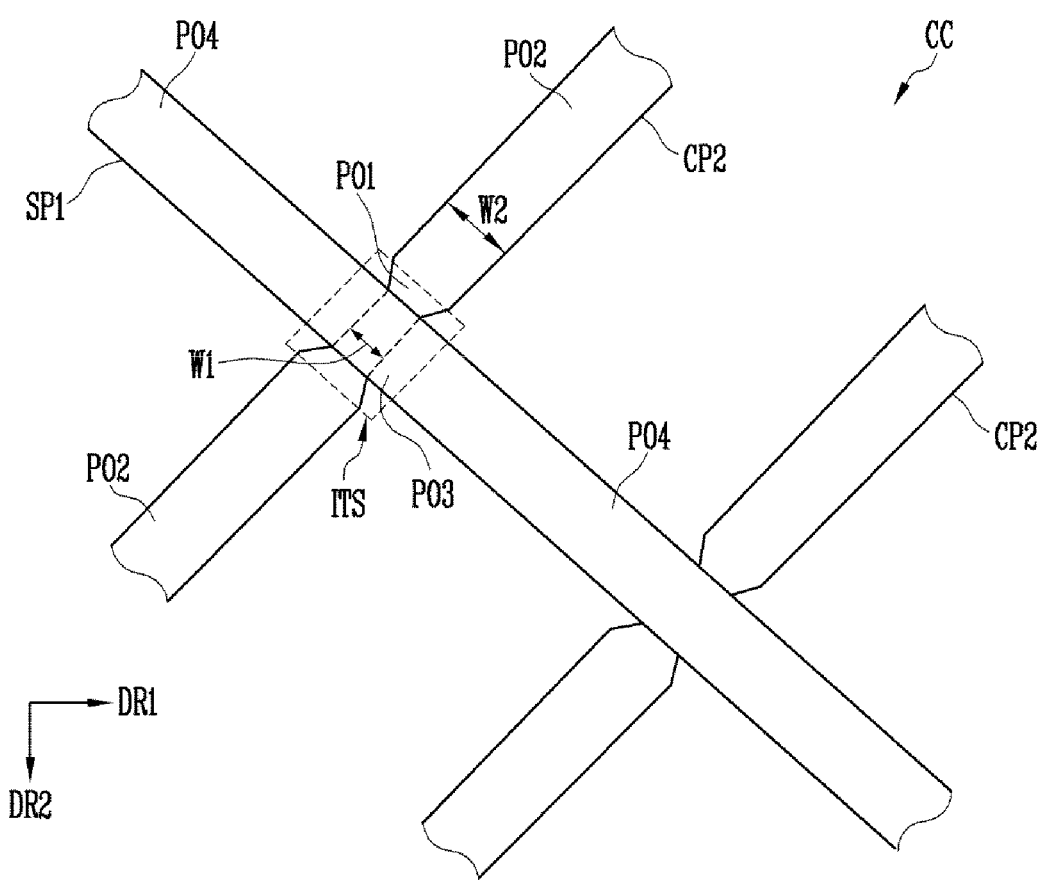
FIG. 11A, FIG. 11B, and FIG. 11C are enlarged views schematically illustrating examples of a CC portion of an input sensing unit of FIG. 10.
Figure 11B:
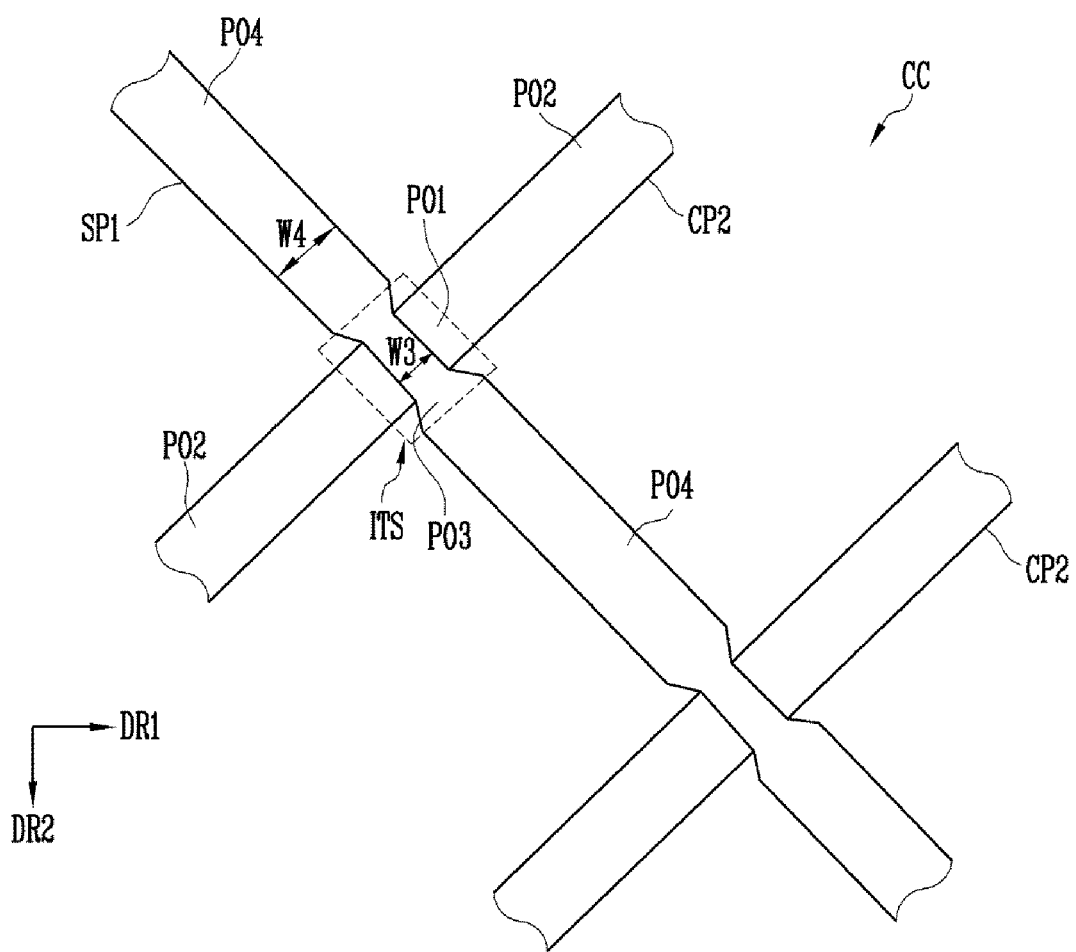
Figure 11C:
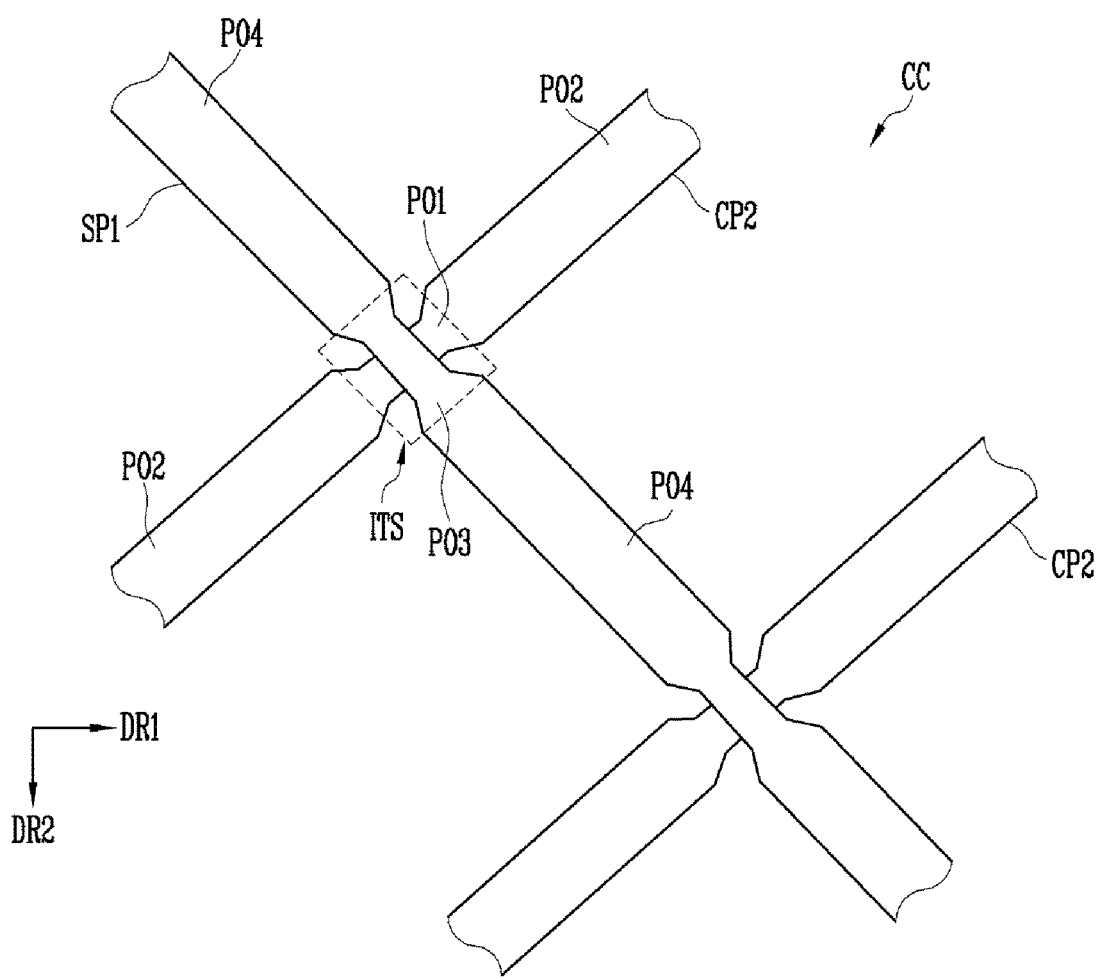

FIGS. 11A to 11C are enlarged views schematically illustrating examples of a CC portion of an input sensing unit of FIG. 10.

Referring to FIGS. 4 and 10 to 11C, an input sensing unit ISL may include a first conductive pattern CD1 and a second conductive pattern CD2 overlapping each other. In an exemplary embodiment, the first conductive pattern CD1 may include a second connection part CP2, and the second conductive pattern CD2 may include a first sensing cell SP1, a second sensing cell SP2, and a first connection part CP1.

The second connection part CP2 may be disposed under the first sensing cell SP1. Accordingly, a crossing region ITS in which the second connection part CP2 and the first sensing cell SP1 cross each other may be formed.

Hereinafter, FIGS. 11A to 11C will be described under the condition that the first conductive pattern CD1 forms the mesh lines of the second connection part CP2 and the second conductive pattern CD2 forms the mesh lines of the first sensing cell SP1.

As shown in FIG. 11A, in an exemplary embodiment, the first width W1 of the first portion PO1 of the second connection part CP2 may be less than the second width W2 of the second portion PO2. The widths of the mesh lines composing the first sensing cell SP1 may be substantially uniform. In an exemplary embodiment, the first portion PO1 of the second connection part CP2 may include a notch. The area of the second connection part CP2 included in the crossing region ITS may be smaller than the area of the second portion PO2 included in the unit region of the same size. Therefore, the overlapping area of the first sensing cell SP1 and the second connection part CP2 may be reduced in the crossing region ITS.

As shown in FIG. 11B, the third width W3 of the third portion PO3 of the first sensing cell SP1 may be less than the fourth width W4 of the fourth portion PO4. The width of the mesh lines composing the second connection part CP2 may be substantially uniform. That is, the width of a portion of the first sensing cell SP1 included in the crossing region ITS may be less than the width of other portions. The area of the first sensing cell SP1 included in the crossing region ITS may be less than the area of the fourth portion PO4 included in the unit region of the same size. Therefore, the overlapping area of the first sensing cell SP1 and the second connection part CP2 may be reduced in the crossing region ITS.

As shown in FIG. 11C, the width of the first portion PO1 of the second connection part CP2 may be less than the width of the second portion PO2, and the width of the third portion PO3 of the first sensing cell SP1 may be less than the width of the fourth portion PO4. That is, the area of the first sensing cell SP1 and the area of the second connection part CP2 included in the crossing region ITS may be smaller than the area of the second portion PO2 and the area of the fourth portion PO4 included in the unit region of the same size, respectively. Therefore, the overlapping area of the first sensing cell SP1 and the second connection part CP2 may be reduced in the crossing region ITS.

Therefore, the possibility that conductive particles are deposited on the first connection part CP1 and the second connection part CP2 may be reduced and a micro resistance and a short circuit incidence due to the conductive particles may be reduced. Therefore, the process failure rate of the input sensing unit ISL and the display device DD may be improved.

Figure 12:
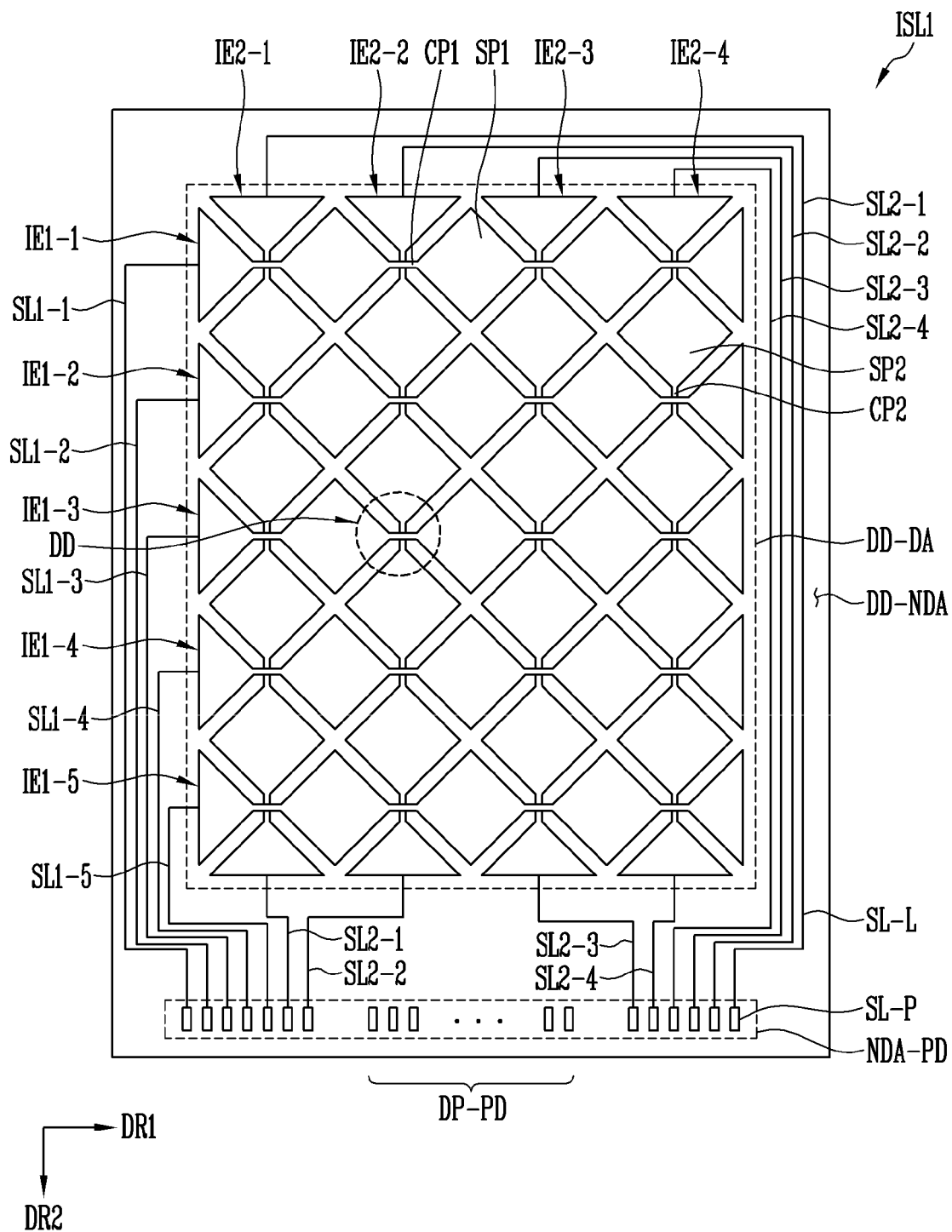
FIG. 12 is a plan view illustrating an example of an input sensing unit included in a display device of FIG. 1.

FIG. 12 is a plan view illustrating an example of an input sensing unit included in a display device of FIG. 1.

In FIG. 12, the same reference numerals are used for the components described with reference to FIG. 4, and a redundant description of these components will be omitted. In addition, the input sensing unit of FIG. 12 may have substantially the same or similar configuration as the input sensing unit of FIG. 4, except for the shapes of a sensing electrode.

Referring to FIG. 12, the input sensing unit ISL1 may include first sensing electrodes IE1-1 to IE1-5, first signal lines SL1-1 to SL1-5 connected to first sensing electrodes IE1-1 to IE1-5, second sensing electrodes IE2-1 to IE2-4 and second sensing lines SL2-1 to SL2-4 connected to the second sensing electrodes IE2-1 to IE2-4.

In an exemplary embodiment, the input sensing unit ISL1 may further include an optical dummy electrode disposed in a boundary region between the first sensing electrodes IE1-1 to IE1-5 and the second sensing electrodes IE2-1 to IE2-4.

In an exemplary embodiment, the first sensing electrodes IE1-1 to IE1-5 and the second sensing electrodes IE2-1 to IE2-4 may have a rhombus shape. In an exemplary embodiment, the first sensing electrodes IE1-1 to IE1-5 and the second sensing electrodes IE2-1 to IE2-4 may have a shape (e.g., a bar shape) without distinction between the sensing cell and the connection part. The first sensing cells SP1 and the second sensing cells SP2 having a rhombus shape are illustrated, but the inventive concepts are not limited thereto, and the first sensing cells SP1 and the second sensing cells SP2 may have other polygonal shapes.

In an exemplary embodiment, the first connection parts CP1, the first sensing cells SP1 and the second sensing cells SP2 may be disposed on the same layer, and the second connection parts CP2 may be disposed on the different layer from the first connection parts CP1, the first sensing cells SP1 and the second sensing cells SP2. Accordingly, the first sensing electrodes IE1-1 to IE1-5 and the second sensing electrodes IE2-1 to IE2-4 are not short-circuited to each other. For example, the second connection parts CP2 may be disposed under the first connection parts CP1, the first sensing cells SP1 and the second sensing cells SP2 with the insulation layer interposed therebetween.

Figure 13:
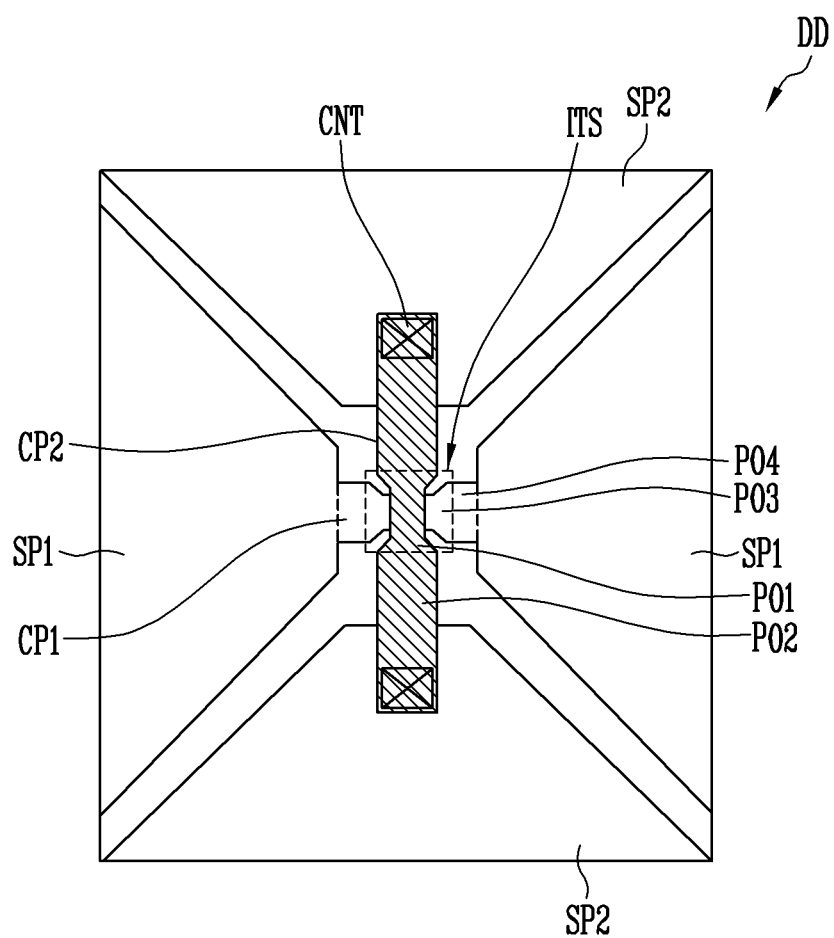
FIG. 13 and FIG. 14 are enlarged views schematically illustrating examples of a DD portion of an input sensing unit of FIG. 12.
Figure 14:
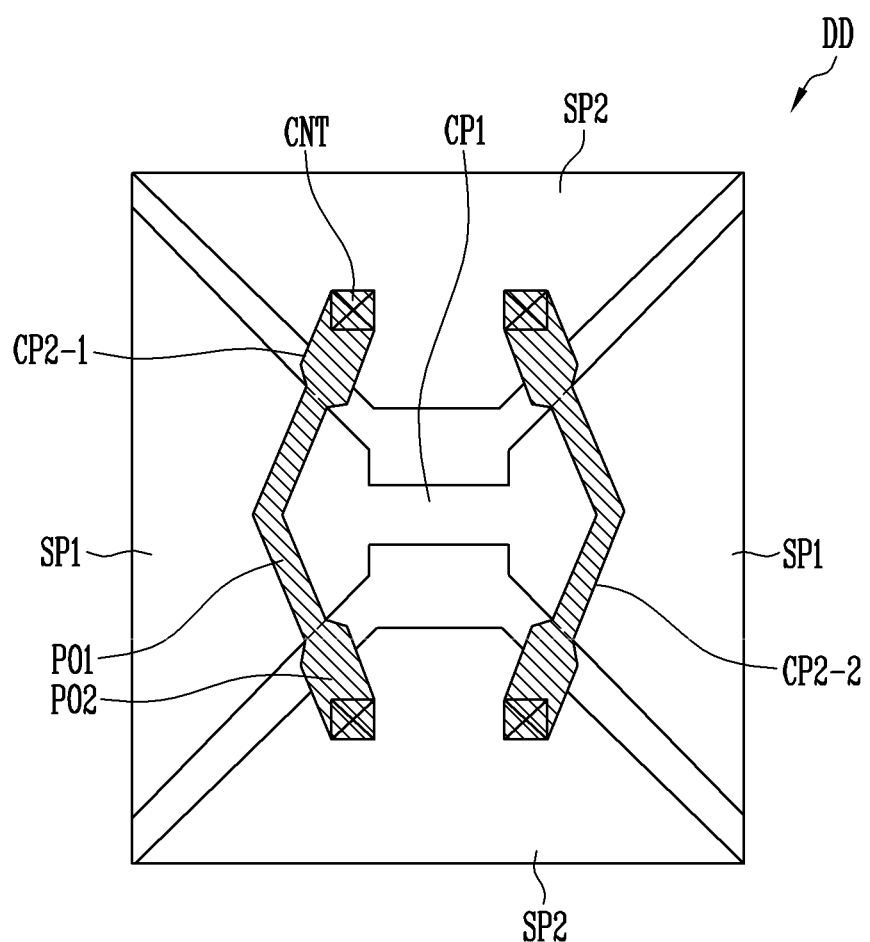

FIGS. 13 and 14 are enlarged views schematically illustrating examples of a DD portion of an input sensing unit of FIG. 12.

Referring to FIGS. 13 and 14, the input sensing unit ISL1 may include a first conductive pattern and a second conductive pattern with the insulation layer interposed therebetween.

In an exemplary embodiment, the first conductive pattern may include a second connection part CP2, and the second conductive pattern may include a first sensing cell SP1, a second sensing cell SP2, and a first connection part CP1. For example, the second connection part CP2 may be disposed under the first connection part CP1.

Second sensing cells SP2 adjacent to each other may be connected to the second connection part CP2 through a contact hole CNT passing through the insulation layer. Therefore, the second sensing cells SP2 arranged in the second direction DR2 may be electrically connected with each other.

As shown in FIG. 13, the first connection part CP1 and the second connection part CP2 may overlap each other in the crossing region ITS. In an exemplary embodiment, the width of the first portion PO1 of the second connection part CP2 corresponding to the crossing region ITS may be narrower than the width of the second portion PO2 of the second connection part CP2 outside the crossing region ITS. Also, the width of the third portion PO3 of the first connection part CP1 corresponding to the crossing region ITS may be narrower than the width of the fourth portion PO4 of the first connection part CP1 outside the crossing region ITS. Therefore, an overlapping area of the first connection part CP1 and the second connection part CP2 in the crossing region ITS may be reduced.

As shown in FIG. 14, the first sensing cell SP1 and the second connection part CP2-1 and CP2-2 may overlap each other. Two second connection parts CP2-1 and CP2-2 may connect the second sensing cells SP2 adjacent to each other. However, this is merely an example, and the number of second connection parts connecting second sensing cells SP2 adjacent to each other is not limited thereto.

In an exemplary embodiment, the width of the first portion PO1 of the second connection part CP2 overlapping the first sensing cell SP1 may be less than the width of the second portion PO2 of the second connection part CP2, which does not overlap the first sensing cell SP1. Therefore, the area of the overlapping region of the first sensing cell SP1 and the second connection part CP2 may be reduced.

As described above, the width of the conductive pattern of a portion where the second connection part CP2 and the first sensing cell SP1 overlap, or the width of the conductive pattern of a portion where the second connection part CP2 and the first connection part CP1 overlap may be less than the other portion of the conductive pattern. Therefore, the area where the second connection part CP2 overlaps the first sensing cell SP1 or the area where the second connection part CP2 overlaps the first connection part CP1 may be reduced to less than half of the conventional area. Therefore, the possibility that conductive particles are deposited on the first conductive pattern and/or the second conductive pattern may be reduced, so that a micro resistance and a short circuit incidence due to the conductive particles may be reduced in the input sensing unit ISL and ISL1. Therefore, the process failure rate of the input sensing unit ISL and ISL1 and the display device DD may be improved.

An input sensing unit according to exemplary embodiments of the present invention and a display device including the same may have a width of a portion less than a width of other portions, the portion where the second connection part and the first sensing electrode formed respectively by the first conductive pattern and the second conductive pattern and the first sensing electrode overlaps and crosses each other. Thus, the overlapping area between the second connection part and the first sensing electrode can be reduced to less than half of the conventional overlapping area.

Therefore, the possibility that conductive particles are deposited on the first conductive pattern and/or the second conductive pattern may be reduced, so that a micro resistance and a short circuit incidence due to the conductive particles may be reduced in the input sensing unit. Thus, the process inferiority rate of the input sensing unit and display device can be improved.

While exemplary embodiments of the invention are described with reference to the attached drawings, it will be understood by those skilled in the art that various changes in form and details may be made therein without departing from the spirit and scope of the invention as defined by the appended claims.

What is claimed is:

1. A display device comprising:
a display panel comprising a light emitting element and an encapsulation layer covering the light emitting element; and
an input sensing unit disposed on the display panel,
wherein:
the input sensing unit comprises:
a first conductive pattern disposed on the encapsulation layer, the first conductive pattern including a first portion and a second portion extending from the first portion;
an insulation layer covering the first conductive pattern; and
a second conductive pattern disposed on the insulation layer, the second conductive pattern including a third portion overlapping at least a portion of the first portion of the first conductive pattern and a fourth portion extending from the third portion;
a width of the first portion is less than a width of the second portion;
each of the first conductive pattern and the second conductive pattern has a mesh pattern comprising a plurality of mesh lines defining a plurality of mesh holes;
the second conductive pattern comprises:
a first sensing electrode comprising first sensing cells and a first connection part that connects the first sensing cells adjacent to each other, the first sensing electrode extending in a first direction; and
second sensing cells arranged in a second direction crossing the first direction;
the first conductive pattern comprises a second connection part that connects the second sensing cells adjacent to each other to form a second sensing electrode;
the second sensing cells and the second connection part are connected through a contact hole passing through the insulation layer; and
each of the first connection part and the second connection part comprises a plurality of the mesh lines.

2. The display device of claim 1, wherein a width of the third portion is less than a width of the fourth portion.

3. The display device of claim 1 wherein the second portion does not overlap the second conductive pattern and the fourth portion does not overlap the first conductive pattern.

4. The display device of claim 1, wherein:
the first portion and the third portion are in regions included in a crossing region where the first conductive pattern and the second conductive pattern cross; and
an area of the first portion of the first conductive pattern included in the crossing region is smaller than an area of the second portion included in a unit region of a same size as the crossing region.

5. The display device of claim 4, wherein an area of the third portion of the second conductive pattern included in the crossing region is smaller than an area of the fourth portion included in the unit region.

6. The display device of claim 1, wherein a portion of the second connection part overlaps a portion of the first sensing cells adjacent to the second connection part.

7. The display device of claim 6, wherein
the first sensing cell overlapping the second connection part of the first sensing cells includes a portion overlapping the second connection part and a portion not overlapping the second connection part.

8. The display device of claim 1, wherein a width of a portion of the second connection part which overlaps a portion of the second sensing cells is greater than the width of the first portion.

9. The display device of claim 1, wherein a width of a portion of the second connection part which overlaps a portion of the second sensing cells is substantially equal to the width of the second portion.

10. The display device of claim 1, wherein a portion of the second connection part overlaps a portion of the first connection part.

11. The display device of claim 1, wherein
the first connection part includes a portion overlapping a portion of the second connection part and another portion not overlapping the second connection part.

12. The display device of claim 11, wherein a width of the third portion is less than a width of the fourth portion.

13. A display device comprising:
a display panel comprising a light emitting element and an encapsulation layer covering the light emitting element; and
an input sensing unit disposed on the display panel,
wherein:
the input sensing unit comprises:
a second connection part disposed on the encapsulation layer;
an insulation layer covering the second connection part;
a first sensing electrode disposed on the insulation layer, the first sensing electrode comprising first sensing cells and a first connection part connecting the first sensing cells adjacent to each other, and extending in a first direction; and
a second sensing electrode disposed on a same layer as the first sensing electrode and comprising second sensing cells arranged in a second direction crossing the first direction and not contacting the first sensing electrode;
the second sensing electrode is formed by connecting the second sensing cells adjacent to each other through the second connection part;
a width of a first portion of the second connection part including a portion overlapping the first sensing electrode is less than a width of a second portion extending from the first portion;
each of the first sensing electrode and the second sensing electrode has a mesh pattern comprising a plurality of mesh lines defining a plurality of mesh holes; and each of the first connection part and the second connection part comprises a plurality of the mesh lines.

14. The display device of claim 13, wherein the first portion of the second connection part overlaps the first connection part.

15. The display device of claim 14, wherein:
the first connection part includes a third portion overlapping the first portion of the second connection part and a fourth portion extending from the third portion; and
a width of the third portion is less than a width of the fourth portion.

16. The display device of claim 13, wherein the first portion of the second connection part overlaps a first sensing cell of the first sensing cells, which are adjacent to the second connection part.

17. The display device of claim 16, wherein:
the adjacent first sensing cell includes a third portion overlapping the first portion and a fourth portion extending from the third portion; and
a width of the third portion is less than a width of the fourth portion.

18. The display device of claim 13, wherein a width of a portion of the second connection part which overlaps the second sensing electrode is greater than a width of the first portion of the second connection part overlapping the first sensing electrode.

* * * * *